US007936621B2

(12) United States Patent
Okuda et al.

(10) Patent No.: US 7,936,621 B2
(45) Date of Patent: May 3, 2011

(54) SEMICONDUCTOR INTEGRATED CIRCUIT DEVICE

(75) Inventors: Yuichi Okuda, Higashimurayama (JP); Masaru Kokubo, Hanno (JP); Yoshinobu Nakagome, Hamura (JP); Hideharu Yahata, Inagii (JP); Hiroki Miyashita, Higashimurayama (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 16 days.

(21) Appl. No.: 12/577,365

(22) Filed: Oct. 12, 2009

(65) Prior Publication Data
US 2010/0027369 A1 Feb. 4, 2010

Related U.S. Application Data

(60) Division of application No. 12/169,253, filed on Jul. 8, 2008, now Pat. No. 7,602,665, which is a division of application No. 11/298,514, filed on Dec. 12, 2005, now Pat. No. 7,411,805, which is a continuation of application No. 10/965,845, filed on Oct. 18, 2004, now Pat. No. 7,072,242, which is a division of application No. 10/614,242, filed on Jul. 8, 2003, now Pat. No. 6,819,626, which is a division of application No. 10/185,044, filed on Jul. 1, 2002, now Pat. No. 6,594,197, which is a division of application No. 10/036,374, filed on Jan. 7, 2002, now Pat. No. 6,463,008, which is a continuation of application No. 09/629,173, filed on Jul. 31, 2000, now Pat. No. 6,377,511.

(30) Foreign Application Priority Data

Aug. 30, 1999 (JP) .................................. 11-243154

(51) Int. Cl.
*G11C 7/00* (2006.01)

(52) U.S. Cl. .......... 365/194; 365/193; 365/63; 365/226; 365/189.08

(58) Field of Classification Search .................. 365/194, 365/193, 63, 226, 189.08
See application file for complete search history.

(56) References Cited

U.S. PATENT DOCUMENTS 5,359,727 A 10/1994 Kurita et al.
(Continued)

FOREIGN PATENT DOCUMENTS
JP 2-90666 3/1990
(Continued)

OTHER PUBLICATIONS

Johnson et al., "A Variable Delay Line PLL for CPU-Coprocessor Synchronization", *IEEE Journal of Solid-State Circuits*, vol. 23, No. 5, pp. 1218-1223, Oct. 1998.

*Primary Examiner* — Viet Q Nguyen
(74) *Attorney, Agent, or Firm* — Miles & Stockbridge P.C.

(57) ABSTRACT

A clock-generating circuit for forming internal clock signals by comparing a signal obtained by delaying, through a variable delay circuit, an input clock signal input through an external terminal with the input clock signal through a phase comparator circuit, and so controlling the delay time of the variable delay circuit that they are brought into agreement with each other, wherein the clock-generating circuit and an internal circuit to be operated by the clock signals formed thereby are formed on a common semiconductor substrate, and an element-forming region in which the clock-generating circuit is formed is electrically isolated from an element-forming region in which the digital circuit is constituted on the semiconductor substrate relying upon the element-isolation technology. The power-source passages, too, are formed independently of other digital circuits.

8 Claims, 20 Drawing Sheets

U.S. PATENT DOCUMENTS

| | | |
|---|---|---|
| 5,604,710 A | 2/1997 | Tomishima et al. |
| 5,619,148 A | 4/1997 | Guo |
| 5,663,668 A | 9/1997 | Hayashi et al. |
| 5,754,838 A | 5/1998 | Shibata et al. |
| 5,815,462 A * | 9/1998 | Konishi et al. ............ 365/233.11 |
| 5,838,627 A | 11/1998 | Tomishima et al. |
| 5,883,534 A | 3/1999 | Kondoh et al. |
| 5,923,198 A | 7/1999 | Fujioka |
| 5,926,053 A | 7/1999 | McDermott et al. |
| 5,936,441 A | 8/1999 | Kurita |
| 5,943,285 A | 8/1999 | Kohno |
| 5,949,260 A | 9/1999 | Toda |
| 5,953,284 A | 9/1999 | Baker et al. |
| 5,990,714 A | 11/1999 | Takahashi |
| 6,041,013 A | 3/2000 | Kohno |
| 6,069,508 A | 5/2000 | Takai |
| 6,078,514 A * | 6/2000 | Takemae et al. ............... 365/63 |
| 6,081,142 A | 6/2000 | Douchi et al. |
| 6,104,225 A | 8/2000 | Taguchi et al. |
| 6,157,688 A | 12/2000 | Tamura et al. |
| 6,166,990 A | 12/2000 | Ooishi et al. |
| 6,172,537 B1 | 1/2001 | Kanou et al. |
| 6,191,632 B1 | 2/2001 | Iwata |
| 6,194,932 B1 | 2/2001 | Takemae et al. |
| 6,222,406 B1 * | 4/2001 | Noda et al. .................... 327/269 |
| 6,222,792 B1 | 4/2001 | Hanzawa et al. |
| 6,225,840 B1 | 5/2001 | Ishimi |
| 6,229,363 B1 | 5/2001 | Eto et al. |
| 6,259,288 B1 | 7/2001 | Nishimura |
| 6,265,903 B1 | 7/2001 | Takahashi |
| 6,265,918 B1 | 7/2001 | Toda |
| 6,269,051 B1 | 7/2001 | Funaba et al. |
| 6,271,697 B1 | 8/2001 | Hayashi et al. |
| 6,281,725 B1 | 8/2001 | Hanzawa et al. |
| 6,288,585 B1 | 9/2001 | Bando et al. |
| 6,304,117 B1 | 10/2001 | Yamazaki et al. |
| 6,313,674 B1 | 11/2001 | Akita et al. |
| 6,336,901 B1 | 1/2002 | Itonaga et al. |
| 6,346,843 B2 | 2/2002 | Takahashi |
| 6,373,303 B2 | 4/2002 | Akita |
| 6,377,511 B1 * | 4/2002 | Okuda et al. ............. 365/233.11 |
| 6,400,643 B1 | 6/2002 | Setogawa |
| 6,417,715 B2 | 7/2002 | Hamamoto et al. |
| 6,437,619 B2 | 8/2002 | Okuda et al. |
| 6,452,859 B1 | 9/2002 | Shimano et al. |
| 6,463,008 B2 * | 10/2002 | Okuda et al. ............. 365/233.12 |
| 6,518,813 B1 | 2/2003 | Usui |
| 6,577,181 B2 | 6/2003 | Takahashi et al. |
| 6,594,197 B2 * | 7/2003 | Okuda et al. ................... 365/194 |
| 6,603,687 B2 | 8/2003 | Jun et al. |
| 6,621,352 B2 | 9/2003 | Matsumoto et al. |
| 6,703,879 B2 | 3/2004 | Okuda et al. |
| 6,754,133 B2 | 6/2004 | Morita et al. |
| 6,819,626 B2 * | 11/2004 | Okuda et al. ............. 365/233.16 |
| 7,072,242 B2 * | 7/2006 | Okuda et al. ................... 365/154 |
| 7,411,805 B2 * | 8/2008 | Okuda et al. ..................... 365/63 |
| 7,602,665 B2 * | 10/2009 | Okuda et al. ................... 365/226 |
| 2001/0017558 A1 | 8/2001 | Hanzawa et al. |
| 2001/0021953 A1 | 9/2001 | Nakashima |
| 2001/0052808 A1 | 12/2001 | Hamamoto et al. |
| 2002/0008558 A1 | 1/2002 | Okuda et al. |
| 2002/0008589 A1 | 1/2002 | Lanoman et al. |
| 2002/0033737 A1 | 3/2002 | Staszewski et al. |
| 2002/0180500 A1 | 12/2002 | Okuda et al. |
| 2003/0123597 A1 | 7/2003 | Cho |

FOREIGN PATENT DOCUMENTS

| | | |
|---|---|---|
| JP | 10-171774 | 6/1998 |
| JP | 11-31024 | 2/1999 |
| JP | 11-55145 | 2/1999 |
| JP | 11-86546 | 3/1999 |
| JP | 11-205129 | 7/1999 |
| JP | 11-214986 | 8/1999 |
| JP | 2000-124796 | 4/2000 |
| JP | 2000-183730 | 6/2000 |
| JP | 2000-188540 | 7/2000 |
| JP | 2001-1332086 | 11/2001 |
| KR | 1999-13264 | 4/2001 |
| KR | 1999-66713 | 9/2001 |
| KR | 1999-66735 | 1/2002 |

* cited by examiner

SEMICONDUCTOR INTEGRATED CIRCUIT DEVICE

CROSS-REFERENCE TO RELATED APPLICATIONS

This application is a division of Application No. 12/169,253 filed Jul. 8, 2008 now U.S. Pat. No. 7,602,665, which is a division of Application Ser. No. 11/298,514 (now U.S. Pat. No. 7,411,805) filed Dec. 12, 2005, which is a continuation of Application Ser. No. 10/965,845 filed Oct. 18, 2004 (now U.S. Pat. No. 7,072,242), which is a division of Application Ser. No. 10/614,242 filed Jul. 8, 2003 (now U.S. Pat. No. 6,819,626), which is a division of Application Ser. No. 10/185,044 filed Jul. 1, 2002 (now U.S. Pat. No. 6,594,197), which is a division of Application Ser. No. 10/036,374 filed Jan. 7, 2002 (now U.S. Pat. No. 6,463,008), which is a continuation of Application Ser. No. 09/629,173 filed Jul. 31, 2000 (now U.S. Pat. No. 6,377,511).

BACKGROUND OF THE INVENTION

1. Field of the Invention

The present invention relates to a semiconductor integrated circuit device. More particularly, the invention relates to technology that can be effectively utilized for a semiconductor integrated circuit device having a clock-generating circuit for generating clock signals corresponding to clock signals supplied through an external terminals, and that can be effectively utilized chiefly for a synchronous dynamic RAM (random access memory).

2. Prior Art

As a semiconductor integrated circuit device having a digital circuit that operates on clock signals supplied through an external terminal, there has been known a DLL (delay locked loop) which is a circuit for bringing the clock signals supplied through the external terminal into synchronism with the internal clock signals to increase the frequency of the clock signals while preventing reduction in the timing margin caused by a delay relative to the clock signals supplied to the internal circuit. The DLL is constituted by a variable delay circuit for varying the amount of delay and a control circuit for controlling the amount of delay. The phase-synchronizing circuits have been disclosed in Japanese Patent Laid-Open Nos. 90666/1990, 55145/1999 and 171774/1998.

SUMMARY OF THE INVENTION

As a variable delay circuit for the DLL, there can be contrived a digital variable delay circuit for varying the amount of delay by changing over the number of stages of the circuit and an analog variable delay circuit for varying the amount of delay by changing the drive current to the delay element or by changing the load. As the circuit for controlling the amount of delay of the analog DLL by using the analog variable delay circuit, further, there can be contrived a circuit of the digital system that executes a digital control operation and a circuit of the analog system which uses a charge pump or the like. Performances of the DLLs based on the combinations of the circuits can be roughly classified as follows:

(1) Digital control digital DLL: consumes a large amount of power, precision is low, short lock-in cycle, intermediate immunity to noise.

(2) Digital control analog DLL: consumes a large amount of power, precision is high, short lock-in cycle, intermediate immunity to noise.

(3) Analog control analog DLL: consumes a small amount of power, precision is high, long lock-in cycle, poor immunity to noise.

The above-mentioned three kinds of DLLs have their features as described above, and an analog control analog DLL is arrived at if power consumption and precision are pursued. However, the analog control DLL has defects of a long lock-in cycle and relatively poor immunity to noise. Even in the digital control DLL, the variable delay circuit is affected by noise; i.e., immunity to noise is not so good, and improving this defect is meaningful. In the analog control circuit, the control circuit, too, is affected by noise and it is estimated that immunity to noise is poorer than that of the digital control circuit.

In a semiconductor integrated circuit device in which the internal digital circuit is operated by clock signals supplied through an external terminal as represented by a synchronous DRAM (dynamic random access memory), it is expected that input/output operation for the band width, i.e., for the data will be demanded in the future. Thus, there remains a room for improvement for the DLL of either system in connection with the precision, immunity to noise and lock-in cycle.

This invention provides a semiconductor integrated circuit device equipped with a DLL realizing a stable clock-generating operation. The invention further provides a semiconductor integrated circuit device equipped with a clock-generating circuit that uses a DLL of a high precision and of a low power consumption. The invention further provides a semiconductor integrated circuit device equipped with a clock-generating circuit constituted by using a DLL which shortens the lock-in cycle yet maintaining a high precision and consuming a small amount of electric power. The above and other objects as well as novel features of the present invention will become obvious from the description of the specification and the accompanying drawings.

Representative examples of the invention disclosed in this application will now be briefly described. That is, the invention is concerned with a clock-generating circuit for forming internal clock signals by comparing a signal obtained by delaying, through a variable delay circuit, an input clock signal input through an external terminal with the input clock signal through a phase comparator circuit, and so controlling the delay time of the variable delay circuit that they are brought into agreement with each other, wherein the clock-generating circuit and an internal circuit to be operated by the clock signals formed thereby are formed on a common semiconductor substrate, and an element-forming region in which the clock-generating circuit is formed is electrically isolated from an element-forming region in which the digital circuit is constituted on the semiconductor substrate relying upon the element-isolation technology.

Another representative example of the invention disclosed in this application will be briefly described next.

That is, the invention is concerned with a clock-generating circuit for forming internal clock signals by comparing a signal obtained by delaying, through a variable delay circuit, an input clock signal input through an external terminal with the input clock signal through a phase comparator circuit, and so controlling the delay time of the variable delay circuit that they are brought into agreement with each other, wherein the clock-generating circuit and an internal circuit to be operated by the clock signals formed thereby are formed on a common semiconductor substrate, and an operation voltage is applied to the clock-generating circuit by using a dedicated bonding pad and a lead different from those of the power source passage that applies an operation voltage to the internal circuit.

A further representative example of the invention disclosed in this application will be briefly described next.

That is, the invention is concerned with a clock-generating circuit for forming internal clock signals by comparing a signal obtained by delaying, through a variable delay circuit, an input clock signal input through an external terminal with the input clock signal through a phase comparator circuit, and so controlling the delay time of the variable delay circuit that they are brought into agreement with each other, wherein the control circuit so controls the variable delay circuit as to return the amount of delay back in the reverse direction at a moment when the variable delay time has exceeded a target value.

DETAILED DESCRIPTION OF THE INVENTION

Figure 1:
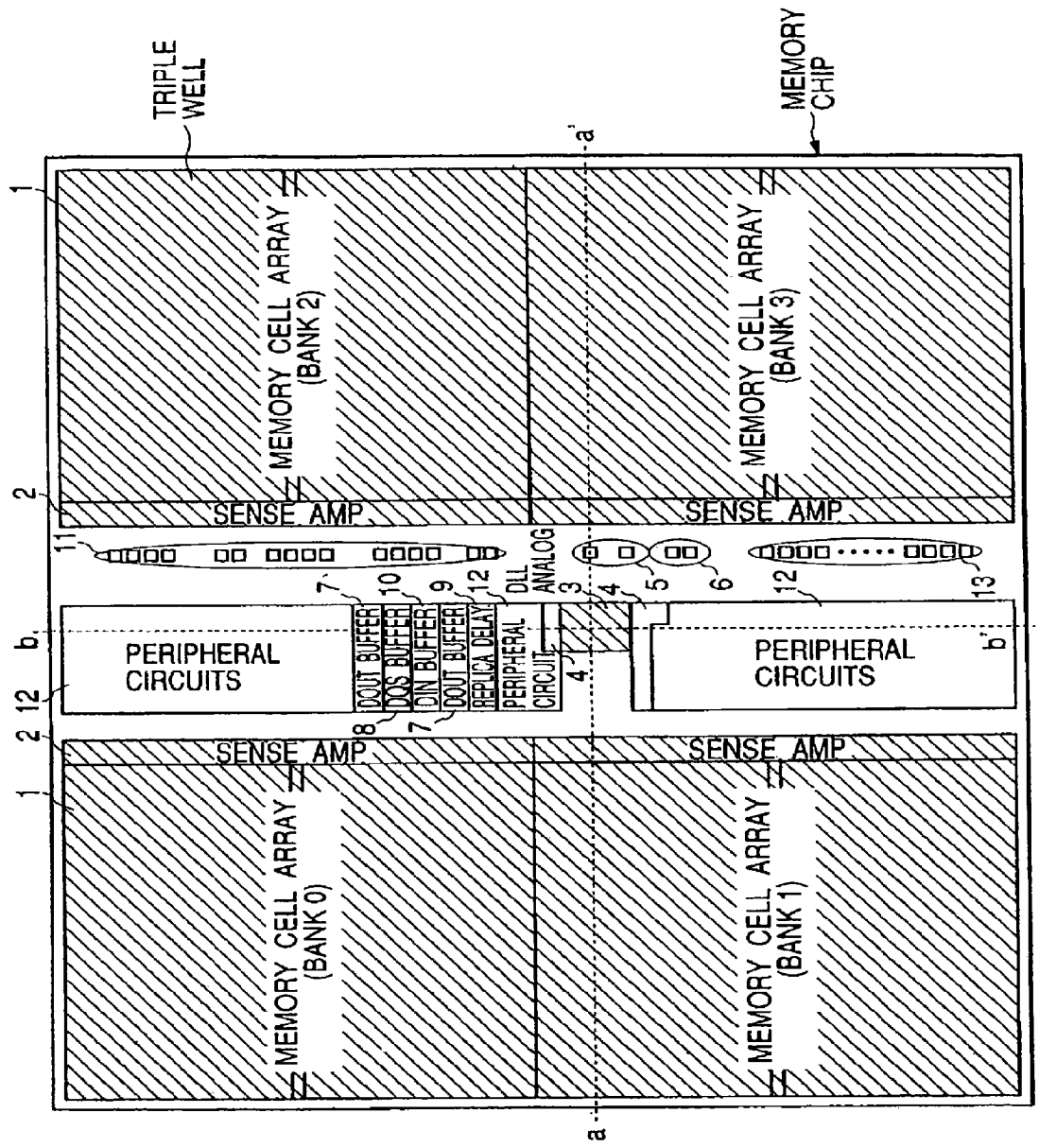
FIG. 1 is a diagram schematically illustrating a layout of a dynamic RAM according to an embodiment of the present invention.

FIG. 1 is a diagram schematically illustrating the layout of an embodiment of a dynamic RAM to which the invention is applied. In FIG. 1, the circuit blocks are formed on a semiconductor substrate such as of a single crystalline silicon according to a known technology for producing semiconductor integrated circuits. The circuits in FIG. 1 are drawn on the semiconductor substrate to nearly meet the geometrical arrangement. In this embodiment, the memory cell array 1 as a whole is divided into four to constitute memory banks (bank 0 to bank 3).

Peripheral circuits 12 inclusive of an address input circuit, a decoder circuit and a control circuit, a data input circuit (Din buffer) 10, as well as a data output circuit (Dout buffer) 7, DQS buffer 8 and a sequence of bonding pads 11, are provided in the central portion along one direction of the chip. In a broad sense, the data input circuit 10 and the data output circuit 7 are included in the peripheral circuit 12. That is, it should be noted that the data input circuit 10, data output circuit 7 and DQS buffer 8 are shown as representative examples of the peripheral circuits. In this embodiment, the peripheral circuits in the above-mentioned broad sense are arranged to be in parallel with the sequence of bonding pads in order to ideally lay out the circuits such as random logic circuit and the like circuits.

When, for example, the sequence of bonding pads and the peripheral circuits are linearly arranged in parallel in the central portion along one direction of the semiconductor chip, limitation is imposed on the number of the bonding pads, and the distance increases for connecting the bonding pads to the peripheral circuits. In this embodiment, the peripheral circuits are arranged in parallel with the sequence of bonding pads. In this constitution, the sequence of bonding pads are arranged at positions deviated from the center line which runs in one direction of the semiconductor chip. As a result, a relatively large area is maintained in the central portion along one direction of the semiconductor chip, enabling the layout of the circuit elements to be favorably designed. That is, even in the constitution in which the peripheral circuits are arranged in parallel with the sequence of bonding pads as in this application, the degree of integration can be enhanced and the speed of operation can be increased compared with when the peripheral circuits are arranged being divided into the right side and the left side with the bonding pads as a center.

The dynamic RAM of this embodiment is directed to the double data rate (DDR) synchronous DRAM (SDRAM) that will be described later, and the peripheral circuits 12 include data output circuit 7, DQS output circuit 8, data input circuit 10 that are described above as representative examples, as well as the circuits that will be described below. A booster circuit forms a boosted voltage VPP higher than the power-source voltage VDD by utilizing a charge pump circuit, and includes a selection circuit for selecting a word line to which a memory cell is connected and a control circuit which determines the selection level for the operation voltage of the circuit for selecting the shared switching MOSFET and for controlling the operation of the booster circuit.

A VDD/2 circuit forms a voltage obtained by dividing the power-source voltage VDD by 2 and forms a reference voltage of the input buffer which is constituted by a differential circuit. The output control circuit controls the operation corresponding to the CAS latency of the data output circuit 7. A Y-predecoder decodes a Y-address signal to form a predecoded signal. The read/write buffer controls the operation of the main amplifier and operates the write amplifier.

The input circuit of the address system includes an address buffer, an X-address latching circuit and a Y-address latching circuit. A Y-clock-generating circuit generates clock signals corresponding to the operation of the Y-system upon receiving clock signals supplied through an external terminal. A mode decoder/clock buffer and a command circuit form operation control signals. A Y-counter and a control circuit thereof are provided to form Y-system address signals in the burst mode. A refresh control circuit executes an automatic/self refreshing operation, and includes a refresh address counter. There are further provided a bonding option circuit and a power source circuit closure detector circuit.

The bonding pads are formed being nearly linearly arranged along the plural circuit blocks. According to this constitution, the signal transmission paths among the circuit blocks do not become undesirably long avoiding the bonding pads but are formed short to accomplish a high-speed operation as compared with those in which the peripheral circuits are arranged being separated to the right and left sides sandwiching the bonding pads therebetween. Since a circuit block can be formed in a concentrated manner in a substantially large area, the circuit elements can be easily laid out by taking the automatic wiring into consideration as will be described later.

In this embodiment, the clock-generating circuit (DLL analog) 3 is provided nearly at the center of the memory chip. The clock-generating circuit is constituted by an analog circuit that will be described later. There are further provided a circuit for supplying an input signal and a control signal to the above analog circuit, and a digital circuit 4 for producing an internal clock signal.

In this embodiment, the four memory cell arrays 1 that are hatched are formed in the triple wells for which the substrate voltage is set separately from the peripheral circuits 12, thereby to control a threshold voltage for the n-channel MOSFETs that constitute address selection MOSFETs of memory cells in the memory cell array 1, to suppress the leakage current to maintain the time for holding the data, and to suppress a change thereof.

The memory cell array 1 is provided with a sense amplifier (Sense AMP) 2 which also exists in the triple well in which the memory cell array 1 is formed. The sense amplifier is not geometrically arranged at one position only on the semiconductor substrate. In practice, the memory cell array is divided into plural regions depending upon the hierarchical word lines and the hierarchical IO lines, and the sense amplifiers are arranged in a dispersed manner so as to be corresponded to the divided sub-arrays. The DLL analog unit 3 is provided in the triple well at the center of the memory chip. The triple well in the DLL analog unit 3 is isolated from the triple well that includes the memory cell array 1 and the sense amplifier 2. A DLL digital unit 4 is provided adjacent to the DLL analog unit 3, so as to be located on the outside of the triple well.

In this embodiment, a pair of DLL-dedicated power source pads 5 are provided near the DLL analog unit 3. The DLL-dedicated power source pads 5 are connected to the DLL analog unit 3 only to prevent the infiltration of power source noise from other circuit blocks through the power source passage. That is, the DLL-dedicated power source pads 5 are connected to the DLL analog unit 3 only, and receive no noise from the power source wiring that supplies operation voltage to the peripheral circuits 12, to the data output circuit 7 and to the sense amplifier 2, or from the GND wiring.

A DQS buffer 8 is provided neighboring the data output circuit (Dout buffer) 7. A replica delay circuit (replica delay) 9 is provided neighboring the output buffer 7. The replica delay circuit is used as a delay circuit for bringing a clock signal that has passed through the DQS buffer into precise synchronism with the clock signal supplied through the external terminal.

Figure 2:
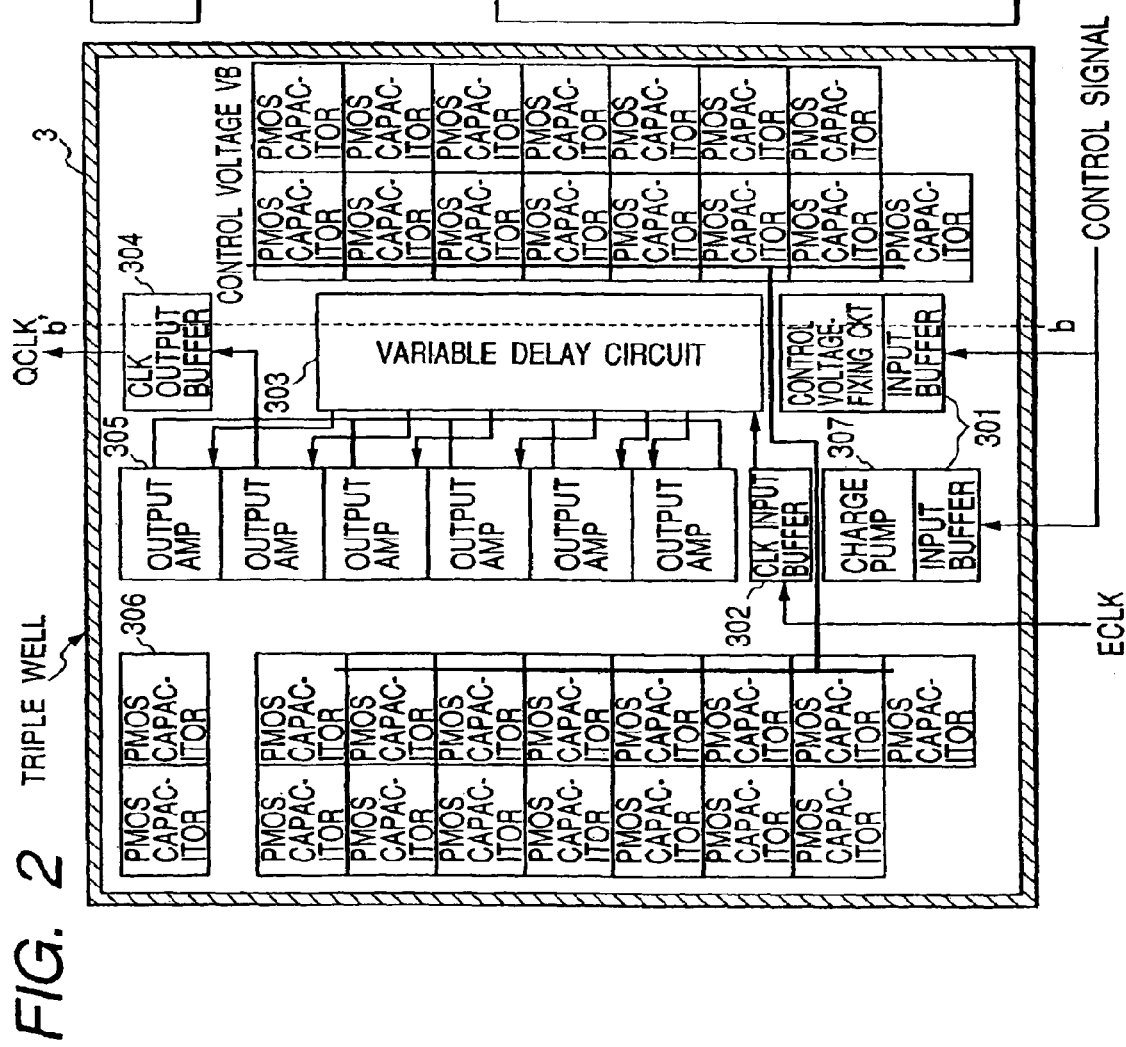
FIG. 2 is a diagram of layout of a DLL analog unit according to the embodiment.

FIG. 2 is a diagram illustrating the layout of the DLL analog unit 3 according to the embodiment. The DLL analog unit 3 is formed in an independent triple well. In FIG. 2, the periphery of the DLL analog unit 3 is hatched to express that the DLL analog unit is formed in a triple well. The DLL analog unit 3 is provided with dedicated power source pads VDD_DLL (PAD) and VSS_DLL (PAD) for supplying operation voltages such as VDd and VSS, which are corresponding to the pads 5 in FIG. 1.

Though there is no particular limitation, a variable delay circuit 303 is constituted by an analog delay circuit which changes the delay time depending upon a change in the operation current which changes depending upon the analog control voltage. The variable delay circuit 303 is constituted by plural stages of delay circuits and is provided with output amplifiers (AMP) 305. The variable delay circuit 303 has six sets of output taps connected to the input terminals of the separate output amplifiers (AMP) 305. Among the six output amplifiers (AMP) 305, only one output amplifier is operating at all times, and the outputs of the output amplifiers 305 that are not in operation exhibit a high impedance. Therefore, the output terminals of the six output amplifiers 305 are connected in common, and only the output signal of the output amplifier 305 that is in operation is effectively used. The number of the output taps and of the output amplifiers is not limited to six only but may be arbitrarily selected.

In this embodiment, though there is no particular limitation, plural PMOS capacitors constituted by using a p-channel MOSFET are provided in the outer periphery of the DLL analog unit 3. These PMOS capacitors are used for holding the control voltage, for smoothing the power source VDD-GND, and as spare capacitors. In FIG. 2, the PMOS capacitors formed sandwiching the variable delay circuit 303 and the output amplifiers 305 therebetween, are connected in parallel by wirings indicated by a solid line in FIG. 2, and are charged and discharged by a charge pump 307 so as to form a control voltage VB. The delay time of the variable delay circuit is controlled by this control voltage VB.

The PMOS capacitors provided on the outer side of the DLL analog unit 3, except the PMOS capacitor used as the charge pump 307, are used for smoothing the power source VDD-VSS (GND). This stabilizes the power source voltage VDD and ground potential VS applied to the circuits that constitute the DLL analog unit 3. That is, the smoothing capacitors are connected between the DLL-dedicated power source pads, i.e., between the VDD_VLL pad and the VSS_DLL pad.

In this embodiment, input buffers 301 that receive control signals fed from a unit outside the DLL analog unit 3 are provided in the triple well. Further, an input buffer 302 is provided in the triple well to supply a clock input signal ECLK fed through the external unit to the variable delay circuit 303. Moreover, a CLK output buffer 304 is provided in the triple well to output a clock output QCL from the selected output amplifier 305 to the data output circuit 7. In this constitution, the phase of the signal QCLK is controlled by the control voltage VB that is output as the charge pump 307 is driven by the control signal.

In this embodiment, the variable delay circuit 303 and the charge pump 307 susceptible to noise are arranged at the center in the triple well maintaining a distance from the surrounding noise sources to prevent the infiltration of noise. The control signal from the external unit is once passed through the buffer in the DLL analog unit 3 to prevent the infiltration of noise transmitted being superposed on the control signal. The DLL-dedicated power source is connected to the DLL analog unit 3, and does not receive noise that infiltrates through the power source wiring and VSS (GND) wiring. As described above, the variable delay circuit 303 is provided with six output taps to select any one of the six output amplifiers 305 and, hence, to select the number of stages of the variable delay circuits. This makes it possible to accomplish the adjustment even when the range of variable delay is outside the desired value.

Figure 3:
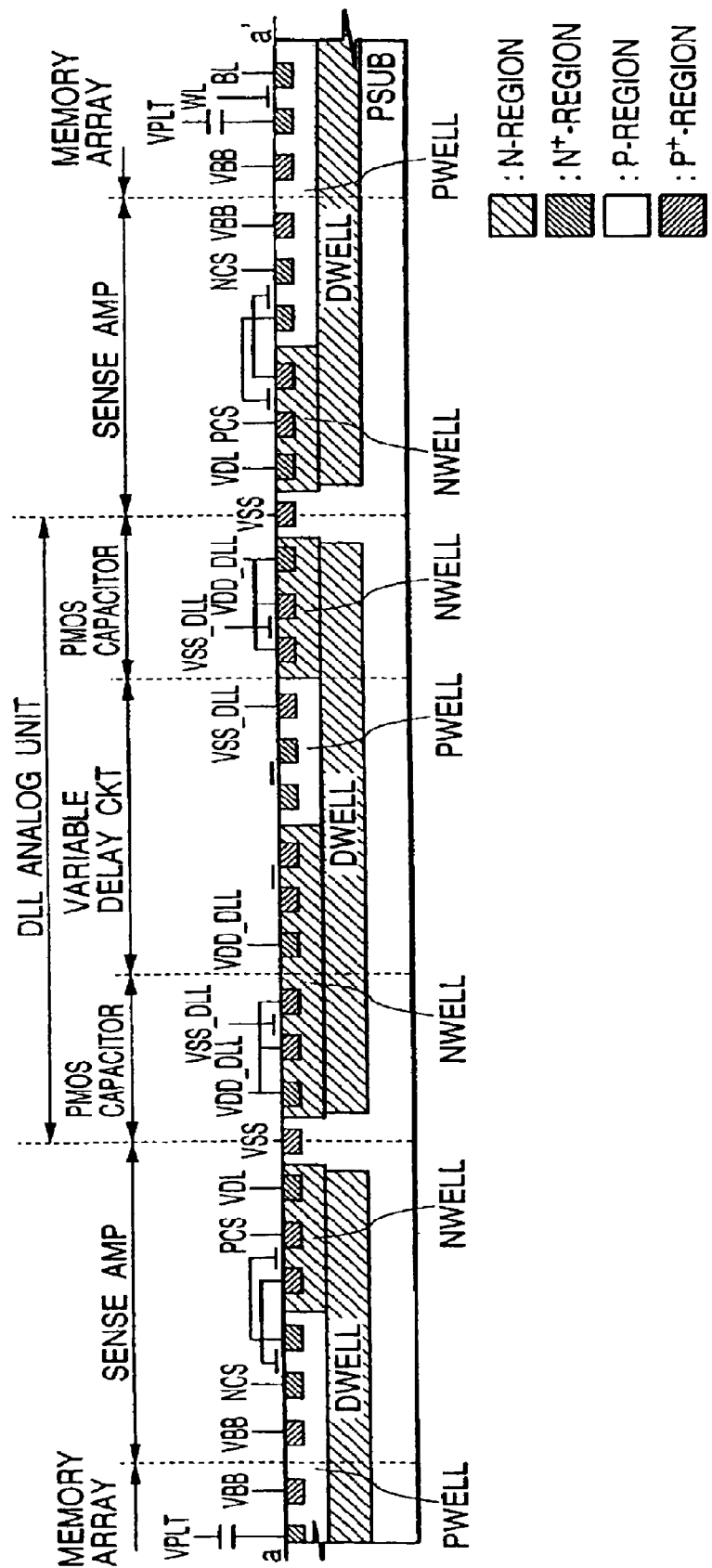
FIG. 3 is a sectional view schematically illustrating the structure of elements in a semiconductor integrated circuit device according to the embodiment of the invention.

FIG. 3 is a sectional view schematically illustrating the structure of elements in the semiconductor integrated circuit device according to the embodiment of the invention, and is a cross section along the line a-a' of FIG. 1. As shown, the DWELL including a memory cell array 1 and the DWELL including the DLL analog unit 3 are electrically insulated by the PN junction isolation. Therefore, despite the circuits are formed on the same p-type substrate PSUB, noise from the sense amplifier 2 which is a large source of noise is prevented from infiltrating through the substrate PSUB.

Further, the substrate power source for the DWELL that includes the memory cell array 1 and for the DWELL that includes the DLL analog unit 3, has bonding pads and leads that are exclusively provided, and does not receive noise generated in the power source passage. Concretely speaking, the power source pads and VSS pad are exclusively provided for the DLL analog unit 3, and are wire-bonded to dedicated external leads. When the DLL analog unit 3 is used as a voltage-dropping power source, a power source circuit dedicated to the DLL analog unit is provided in addition to the power source pads and the leads.

Figure 4:
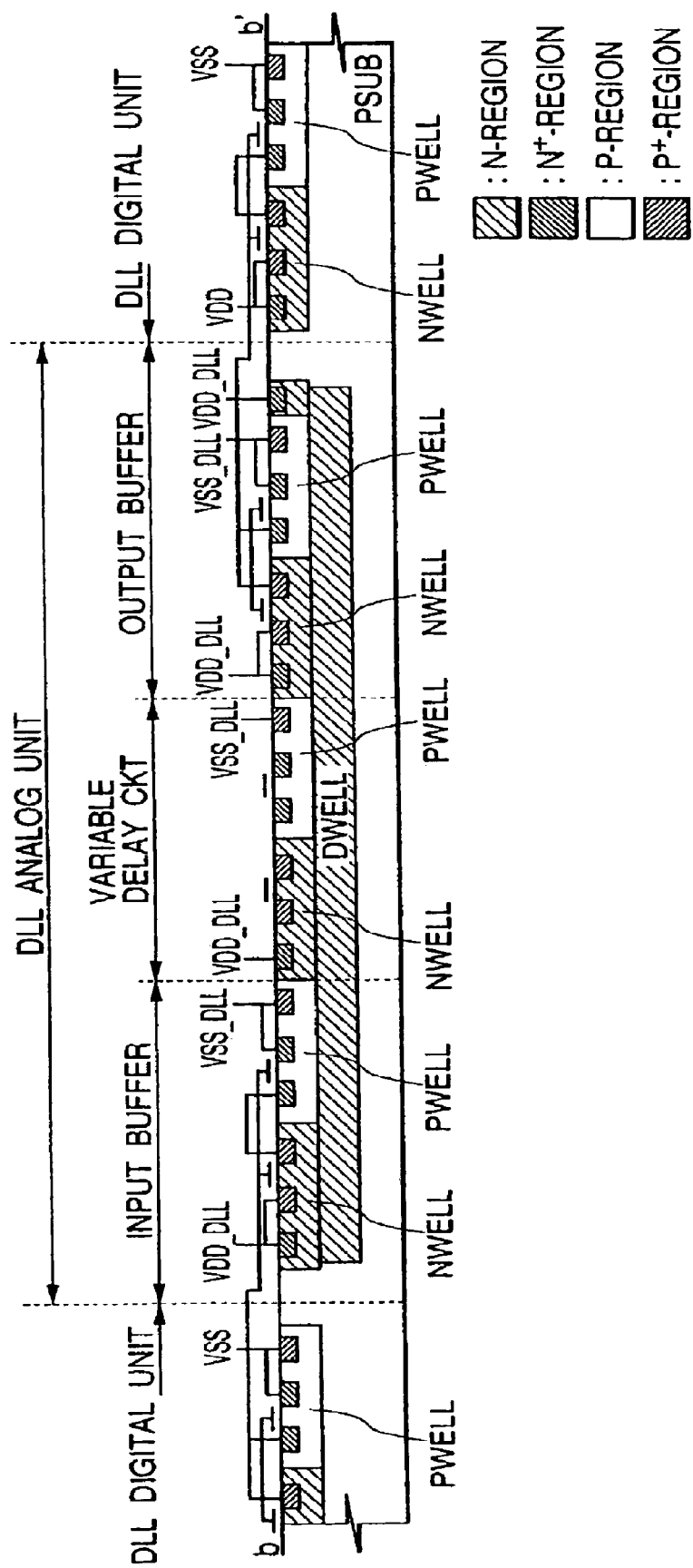
FIG. 4 is a sectional view schematically illustrating the structure of elements in a semiconductor integrated circuit device according to the embodiment of the invention.

FIG. 4 is a sectional view schematically illustrating the structure of elements in the semiconductor integrated circuit device according to the embodiment of the invention, and is a sectional view along the line b-b' of FIG. 1. The peripheral circuits 12 inclusive of the DLL digital unit 4 are formed in the well regions NWELL and PWELL on the p-type substrate PSUB on the outer side of the triple WELL, preventing noise due to digital signals from infiltrating into the DLL analog unit 3 through the substrate PSUB. In this embodiment, the signals from the DLL digital unit 4 to the DLL analog unit 3 are passed through the input buffer in the DLL analog unit, preventing the noise components included in the digital signals from infiltrating into the charge pump or the variable delay circuit.

Figure 5:
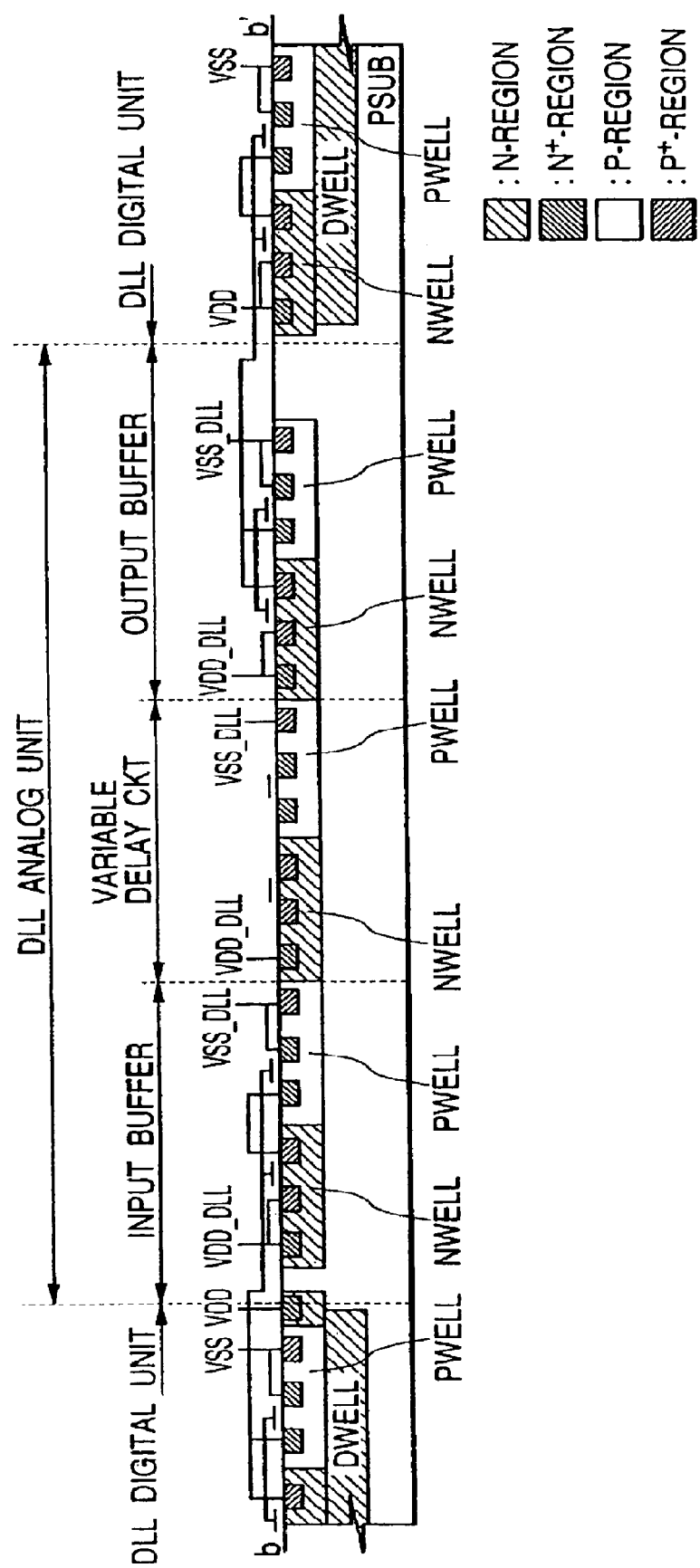
FIG. 5 is a sectional view schematically illustrating the structure of elements in a semiconductor integrated circuit device according to another embodiment of the invention.

FIG. 5 is a sectional view schematically illustrating the structure of elements in the semiconductor integrated circuit device according to another embodiment of the invention, which is a modified embodiment corresponding to b-b' of FIG. 1. In this embodiment contrary to that of FIG. 4, the peripheral circuits 12 inclusive of the DLL digital unit 4 are arranged in the triple WELL, and the DLL analog unit 3 is disposed on the outer side of the triple well. The peripheral circuits and the DLL analog unit 3 in the substrate are insulated by the element isolation technology based upon the triple well. In this case, too, therefore, the infiltration of noise is prevented. The above two embodiments are the same in a meaning that the peripheral circuits including the DLL digital unit 4 are electrically isolated from the DLL analog unit 3 by the element isolation technology based on the triple well. In this case, the triple well including the memory cell array 1 is isolated from the triple well that includes the peripheral circuits. This is because, the memory cell array 1 is disposed in the triple well in order to apply the substrate potential independently of others rather than to cope with the noise.

In the analog control analog DLL of this embodiment, the variable delay circuit 303 and the charge pump (analog control circuit) 307 are susceptible to noise. Therefore, these two circuits are isolated from the surrounding noise sources. In the DRAM which includes noise sources such as sense amplifiers (Sense AMP) as well as many noise sources in the periphery, in particular, the separation from the noise sources offers a large effect. As will be described later, further, there is employed a new system for driving the charge pump which is an analog control circuit, and contrivance is made to eliminate an insensitive band which is the defect of PFD in the conventional drive system and to shorten the lock-in cycle.

The isolation of the DLL circuit from other circuits offers particularly distinguished effect in the analog control analog DLL. However, noise generated in the chip can also be effectively shut off even in the digital control digital DLL and in the digital control analog DLL, making it possible to enhance the immunity of the DLL against the noise. That is, even in the digital DLL, when the operation voltage applied to the inverter circuit constituting the delay circuit varies due to noise in the power source, the charge-up current for the capacitive load and the discharge current undergo a change in response thereto, resulting in a change in the delay time.

That is, the power-source voltage VDD and the ground voltage VSS are used as a substrate bias voltage for the MOSFET and cause a change in the threshold voltage and, further, causes a change in the input signal applied across the gate and the source of the MOSFET. Thus, since both the input voltage and the threshold voltage are subject to change due to noise on the power source voltage and on the ground line, the delay time has changed so far in the conventional digital DLL and, as a result, jittering (fluctuation in the phase) has occurred in the output clock signals. Upon applying the invention of the application to a clock-generating circuit which uses DLL, therefore, the DLL exhibits improved immunity against noise; i.e., jittering of the DLL can be decreased under the same noise condition or jittering from other circuits can be more absorbed.

Figure 6:
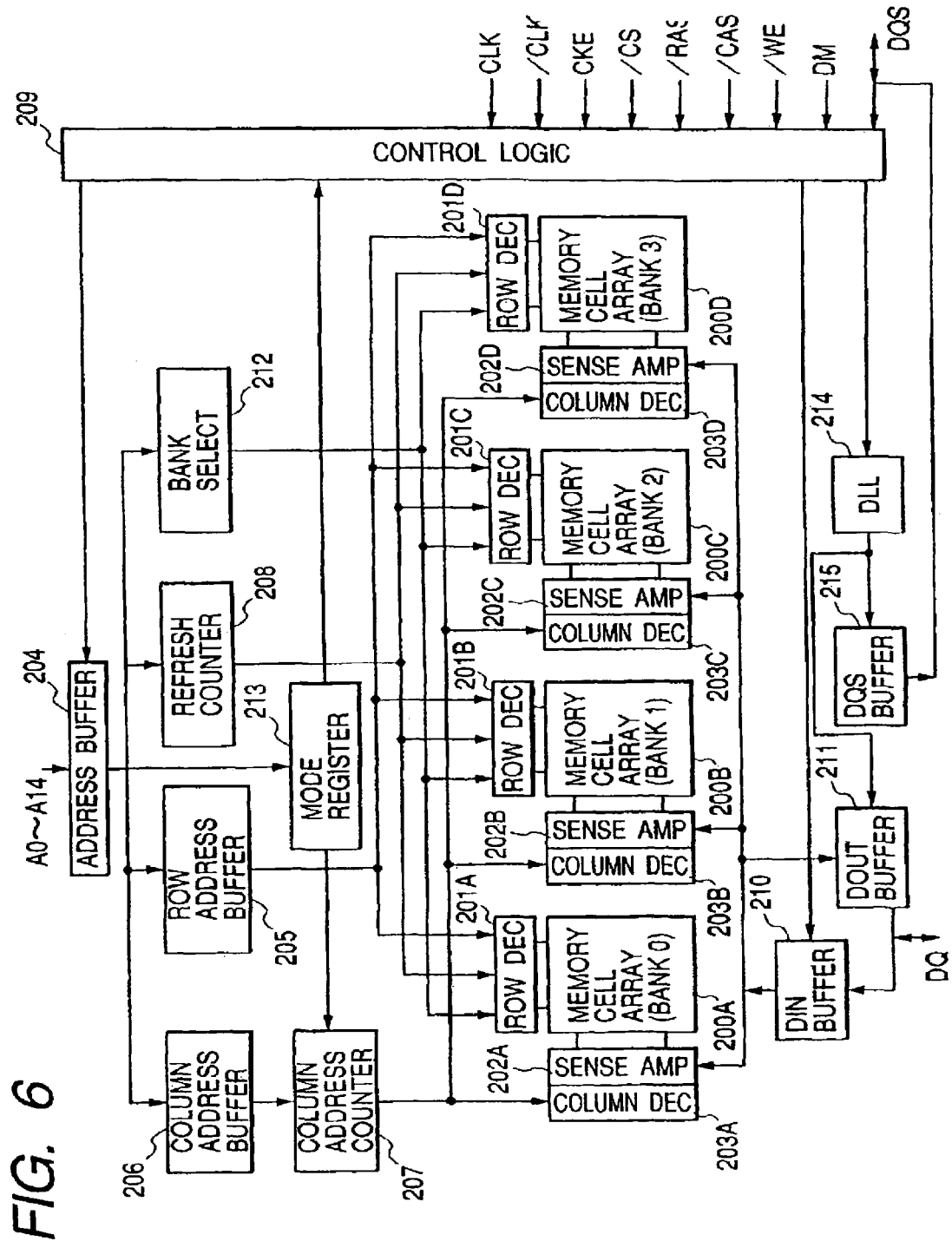
FIG. 6 is a block diagram illustrating the whole synchronous DRAM according to the embodiment of the invention.

FIG. 6 is a block diagram illustrating an embodiment of the whole DDR SDRAM (double data rate synchronous dynamic random access memory) to which the invention is applied. Though there is no particular limitation, the DDR SDRAM of this embodiment is provided with four memory arrays 200A to 200D to correspond to the four memory banks. The memory arrays 200A to 200D corresponded to the four memory banks 0 to 3 are equipped with dynamic memory cells arranged in the form of a matrix. In FIG. 6, the terminals for selecting memory cells arranged along the same column are coupled to the word lines (not shown) of every column, and the data input/output terminals of the memory cells arranged along the same row are coupled to complementary data lines (not shown) of every row.

Among the word lines (not shown) in the memory array 200A, one word line is driven to a selection level depending upon the result of decoding the row address signal by the row decoder (row DEC) 201A. The complementary data lines (not shown) of the memory array 200A are coupled to the I/O lines of the sense amplifier (sense AMP) 202A and of the column selection circuit (column DEC) 203A. The sense amplifier 202A detects and amplifiers a very small potential difference appearing on the complementary data lines as the data is read out from the memory cells. A column selection circuit 203A therein includes a switching circuit for selecting the complementary data lines and for rendering the complementary I/O lines to be conductive. The column switching circuit is selectively operated depending upon the result of decoding the column address signal by the column decoder 203A.

Similarly, memory arrays 200B to 200D, too, are provided with row decoders 201B to D, sense amplifiers 203B to D and column selection circuits 203B to D. The complementary I/O lines are provided in common for the memory banks, and are connected to the output terminals of the data input circuit (Din buffer) 210 having a write buffer and to the input terminals of the data output circuit (Dout buffer) 211 having a main amplifier. Though there is no particular limitation, the terminal DQ is a data input/output terminal for inputting or outputting data D0 to D15 consisting of 16 bits. A DQS buffer (DQS buffer) 215 forms a data strobe signal of data output from the terminal DQ.

The address signals A0 to A14 supplied through the address input terminal are once held by an address buffer 204. Among the address signals input in time series, row address signals are held by a row address buffer 205 and column address signals are held by a column address buffer 206. A refresh counter 208 generates a row address at the time of automatic refreshing and self refreshing operations.

When the device has a storage capacity of, for example, 256 megabits, the column address signals are such that, when a memory access is to be executed in a unit of two bits, an address terminal is provided to receive an address signal A14. In the case of the x4 bit constitution, signals of up to an address signal A11 are effectively used. In the case of the x8 bit constitution, signals of up to an address signal A10 are effectively used and in the case of the x16 bit constitution, signals of up to an address signal A9 are effectively used. In the case of the storage capacity of 64 megabits, signals of up to the address signal A10 are effectively used in the x4 bit constitution, signals of up to the address signal A9 are effectively used in the x8 bit constitution, and signals of up to the address signal A8 are effectively used in the x16 bit constitution as shown.

The output of the column address buffer 206 is supplied as a preset data for the column address counter 207. The column address counter 207 sends the column address signal which is the preset data or a value obtained by successively increasing the column address signal, to the column decoders 203A to 203D on a burst mode specified by a command that will be described later.

A mode register 213 holds various operation mode data. Among the row decoders 201A to D, only those corresponding to the bank specified by a bank select circuit 212 work to select the word line. Though there is no particular limitation, a control circuit (control logic) 209 receives external control signals such as clock signal CLK, /CLK (signal having a symbol / means that it is a row enable signal), clock enable signal CKE, chip select signal ICS, column address strobe signal /CAS, row address strobe signal /RAS and a write enable signal /WE, as well as /DM, DQS and an address signal through a mode register 213. Based upon a change in the levels of these signals and timings, the control circuit 209 forms an internal timing signal for controlling the operation mode of DDR SDRAM and for controlling the operation of the circuit blocks, and is provided with an input buffer for the signals.

The clock signals CLK and /CLK are input to the DLL circuit 214 that was described above via a clock buffer to generate internal clocks. Though there is no particular limitation, the internal clocks are used as input signals to the data output circuit 211 and to the DQS buffer 215. Further, the clock signals supplied through the clock buffer are fed to the clock terminal so as to be supplied to the data input circuit 210 and to the column address counter 207.

Other external input signals become significant in synchronism with the rising edges of the internal clock signals. The chip select signal /CS instructs the start of a command input cycle depending upon its low level. The chip select signal /CS having a high level (chip non-selected state) and other inputs have no meaning. However, the state of selecting the memory bank and the internal operation such as burst operation that will be described later, are not affected by a change into the non-selected state. Signals /RAS, /CAS and /WE have functions different from the corresponding signals in an ordinary DRAM, and become significant in defining a command cycle that will be described later.

The clock enable signal CKE is the one for instructing the validity of the next clock signal. The rising edge of a next clock signal CLK becomes effective when the signal CKE has a high level, and becomes invalid when the signal CKE has a low level. In the read mode, when an external control signal /OE is provided for controlling the output enable for the data output circuit 211, the signal /OE, too, is supplied to the control circuit 209. When the signal /OE has the high level, the data output circuit 211 assumes a high output impedance state.

The row address signal is defined by the levels A0 to A11 in the row address strobe bank active command cycle that will be described later and is in synchronism with the rising edge of the clock signal CLK (internal clock signal).

The address signals A12 and A13 are regarded as bank selection signals in the row address strobe/bank active command cycle. That is, one memory bank is selected out of the four memory banks 0 to 3 depending upon the combination of A12 and A13. Though there is no particular limitation, the control operation for selecting the memory bank is carried out by activating the row decoder only on the side of the selected memory bank, by selecting none of the column switching circuits on the side of the non-selected memory bank, or by the connection to the data input circuit 210 and to the data output circuit on the side of the selected memory bank only.

In the case of the x16 bit constitution with 256 megabits as described above, the column address signal can be defined by the levels A0 to A9 in the read or write command (column address read command or column address write command described later) cycle in synchronism with the rising edge of the clock signal CLK (internal clock). The thus defined column address is used as a start address of burst access.

Next, described below are principal operation modes of the SDRAM instructed by the command.

(1) Mode Register Set Command (Mo).

This is a command for setting the mode register 30. The command is designated by the signals /CS, /RAS, /CAS and /WE=low level, and the data to be set (register set data) is given through A0 to A11. Though there is no particular limitation, the register set data are burst length, CAS latency and write mode. Though there is no particular limitation, the burst length that can be set is 2, 4 or 8, the CAS latency that can be set is 2 or 2.5, and the write mode that can be set is a burst write or a single write.

The CAS latency instructs how may cycles of internal clock signals be used from the break of /CAS to the output operation of the output buffer 211 in the reading operation instructed by a column address read command that will be described later. The internal operation time is necessary for reading the data until the reading data is defined, and is set depending upon the frequency of the internal clock signals. In other words, when internal clock signals of a high frequency are used, the CAS latency is set to a relatively large value and when internal clock signals of a low frequency are used, the CAS latency is set to a relatively small value.

(2) Row Address Strobe/Bank Active Command (Ac).

This is a command for effectively instructing the row address strobe and for effectively selecting the memory bank by A12 and A13, and is instructed by the signals /CS, /RAS=low level, and by the signals /CAS, /WE=high level. At this moment, addresses supplied to A0 to A9 are fetched as row address signals, and signals supplied to A12 to A13 are fetched as memory bank selection signals. The fetching operation is executed in synchronism with the rising edge of the internal clock signals as described above. For example, when the command is designated, a word line is selected in a memory bank that is designated thereby, and a memory cell connected to the word line is rendered conductive to the corresponding complementary data lines.

(3) Column Address/Read Command (Re).

This is a command necessary for starting the burst read operation and for instructing the column address strobe, and is instructed by the signals /CS, /CAS=low level and signals /RAS, /WE=high level. At this moment, the column addresses supplied to A0 to A9 (in the case of the x16 bit constitution) are fetched as column address signals. The column address signals thus fetched are supplied as burst start addresses to the column address counter 207.

In the thus instructed burst read operation, the memory bank and the word line therein have already been selected in the row address strobe/bank active command cycle, and the memory cells of the selected word lines are successively selected and are continuously read out according to the address signals output from the column address counter 207 in synchronism with the internal clock signals. The number of data
continuously read out is the number designated by the burst length. Reading the data from the output buffer 211 is started after having waited for the number of cycles of the internal clock signals specified by the CAS latency (4) Column Address/Write Command (Wr).

This command is instructed by the signals /CS, /CAS, /WE low level and by the signal /RAS=high level. At this moment, addresses supplied to A0 to A9 are fetched as column address signals. In the burst write, the column address signals thus fetched are supplied as burst start addresses to the column address counter 207. The procedure of the thus instructed burst write operation is the same as that of the burst read operation. However, the write operation includes no CAS latency, and fetching the write data starts one clock after the column address/write command cycle.

(5) Precharge Command (Pr).

This is a command for starting the precharging operation for the memory bank selected by A12 and A13, and is instructed by the signals /CS, /RAS, /WE=low level and by the signal /CAS=high level.

(6) Auto Refresh Command.

This is a command necessary for starting the automatic refresh, and is instructed by the signals /CS, /RAS, /CAS=low level, and by the signals /WE, CKE=high level.

(7) No Operation Command (Nop).

This is a command instructing not to substantially carry out the operation, and is instructed by the signal /CS=low level and by the signals /RAS, /CAS, /WE=high level.

In the DDR SDRAM, when another memory bank is instructed and a row address strobe/bank active command is supplied while a burst operation is executed in one memory bank, the operation of the row address system can be carried out in the another memory bank without at all affecting the operation of the above one memory bank.

Therefore, it becomes possible to start the internal operation in advance by issuing a precharge command and a row address strobe/bank active command for a memory bank different from the memory bank in which a command is being executed so far as the data D0 to D15 do not come into collision at the data input/output terminals of, for example, 16 bits. The DDR SDRAM of this embodiment executes the memory access in a unit of 16 bits as described above, possesses addresses of about 4 M relying upon addresses A0 to A11, has four memory banks and, hence, possesses the storage capacity of a total of about 256 megabits (4 M×4 banks× 16 bits).

Described below is the detailed reading operation of the DDR SDRAM. The signals such as chip select signals /CS, /RAS, CAS and write enable signal /WE are input in synchronism with the CLK signals. The raw address and the bank select signal are input simultaneously with /RAS=0, and are held by the row address buffer 205 and by the bank select circuit 212, respectively. A row decoder 210 of a bank designated by the bank select circuit 212 decodes the row address signal, and the data of the whole row are output as very small signals from the memory cell array 200. The very small signals that are output are amplified and held by the sense amplifier 202. The designated bank becomes active.

After 3CLK from the input of the row address, the column address and the bank select signal are input simultaneously with CAS=0, and are held by the column address buffer 206 and the bank select circuit 212. When the designated bank is active, the column address that is held is output from the column address counter 207, and the column decoder 203 selects the column. The selected data are output from the sense amplifier 202. Here, the data are output in an amount of two sets (8 bits in the x4 constitution and 32 bits in the x16 constitution).

The data output from the sense amplifier 202 are sent out of the chip through the data output circuit 211. The output timing varies in synchronism with both the rising and breaking edges of QCLK output from the DLL 214. Here, the data of two sets are subjected to the parallel serial conversion to form data of one set×2. The data strobe signal DQS is output from the DQS buffer 215 simultaneously with the output of data. When the burst length preserved in the mode register 213 is not shorter than 4, the address in the column address counter 207 is automatically increased to read the data of the next column.

The DLL 214 has the role of forming operation clocks QCLK for the data output circuit 211 and for the DQS buffer 215. The data output circuit 211 and the DQS buffer 215 require a time before producing the data signal and the data strobe signal after the internal clock signal QCLK formed by the DLL 214 is input. By advancing the phase of the internal clock signal QCLK to be in advance of the external CLK by using a replica circuit that will be described later, therefore, the phases of the data signal and of the data strobe signal are brought into agreement with that of the external clock CLK. In this case, therefore, the data signal and the data strobe signal are the ones that are brought for their phases into agreement with the external clock signal.

Figure 7:
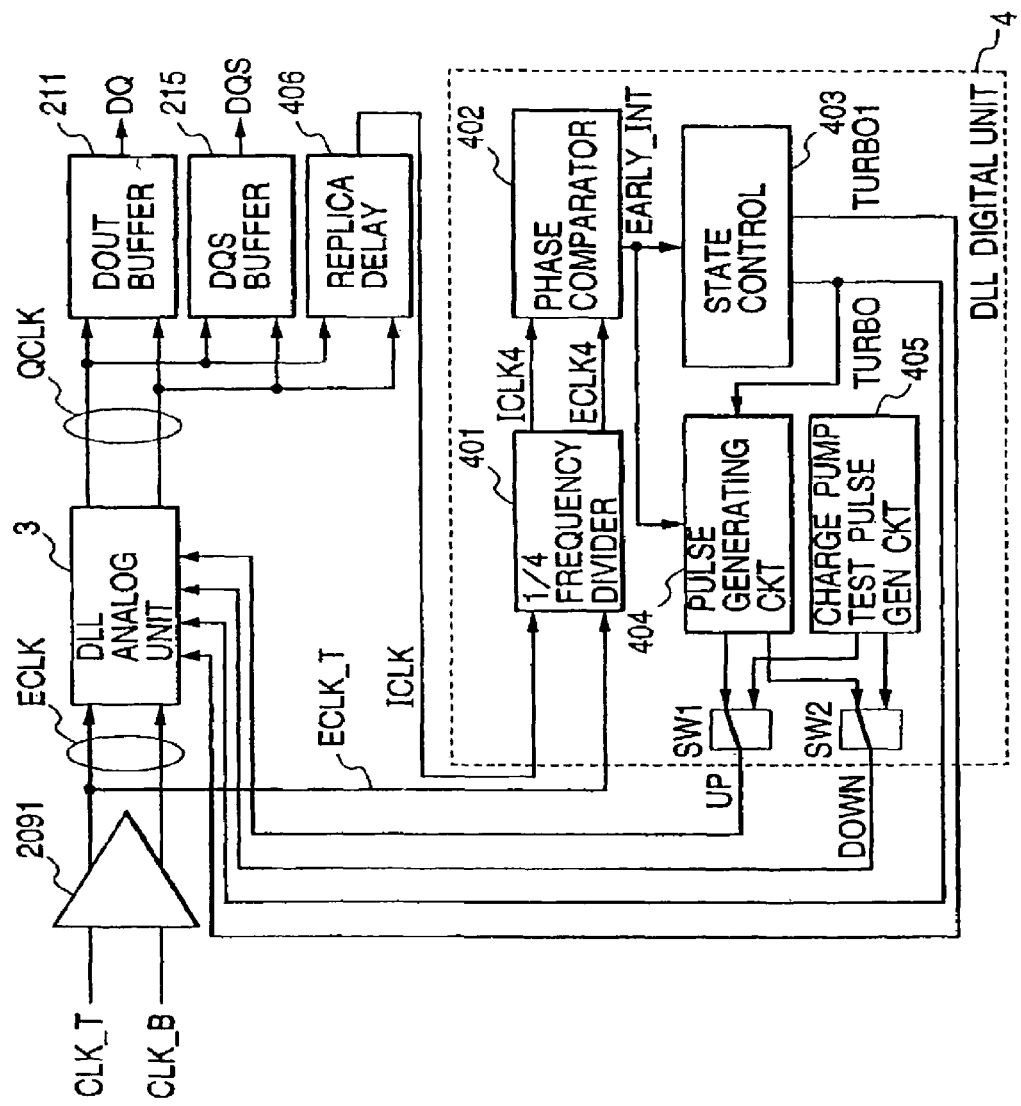
FIG. 7 is a block diagram illustrating the whole DLL according to the embodiment of the invention.

FIG. 7 is a block diagram illustrating the whole DLL according to the embodiment of the invention. FIG. 7 illustrates the whole DLL with the DLL digital unit 4 as a center. The DLL digital unit 4 so controls the DLL analog unit 3 that the external clock signal ECLK_T input through the clock input circuit 2091 and the internal clock signal ICLK are brought in phase with each other.

In order to prevent harmonic locking in the DLL of this embodiment, the frequencies of the external clock signals ECLK_T and of the internal clock signals ICLK are divided into one-fourth through the frequency-dividing circuit 401, respectively. The ECLK4 obtained by dividing the frequency of the external clock signals ECLK_T into one-fourth and the ICLK4 obtained by dividing the frequency of the internal clock signals ICLK into one-fourth are compared for their phases by a phase comparator 402. Upon looking at the waveform of EARLY_INT which is the result of comparison of phases, a state control circuit 403 produces a signal TURBO and a signal TURBO1. A pulse-generating circuit 404 produces an up signal UP and a down signal DOWN to control the operation of the charge pump provided in the DLL analog unit 3.

This embodiment is provided with a charge pump test pulse generating circuit 405. A signal CP_PULSE that will be described later and is produced by this circuit controls the operation of the charge pump in the DLL analog unit 3 instead of the up signal UP and the down signal DOWN to execute the testing thereof. To simplify the drawing, control signals that are not directly related to the invention are not shown.

The frequency-dividing circuit 401 is supplied with clock signals ECLK_T through the clock input circuit 2091 and internal clock signals ICLK through the replica delay 406. Therefore, the ECLK4 and the ICLK4 obtained by dividing their frequencies into one-fourth are compared for their phases by the phase comparator 402. The replica circuit 406 is a delay circuit constituted by the same circuit as the data output circuit 211 or the DQS buffer (output circuit) 215. Since the DLL analog unit 3 forms an internal clock signal QCLK of a phase advanced by the clock input circuit 2091 or by the data output circuit 211 (or DQS buffer 215), the external clock signal CLK_T becomes in phase with, for example, the data signal that is received through the data output circuit 211 or the clock signal output through the DQS buffer 215.

Figure 8:
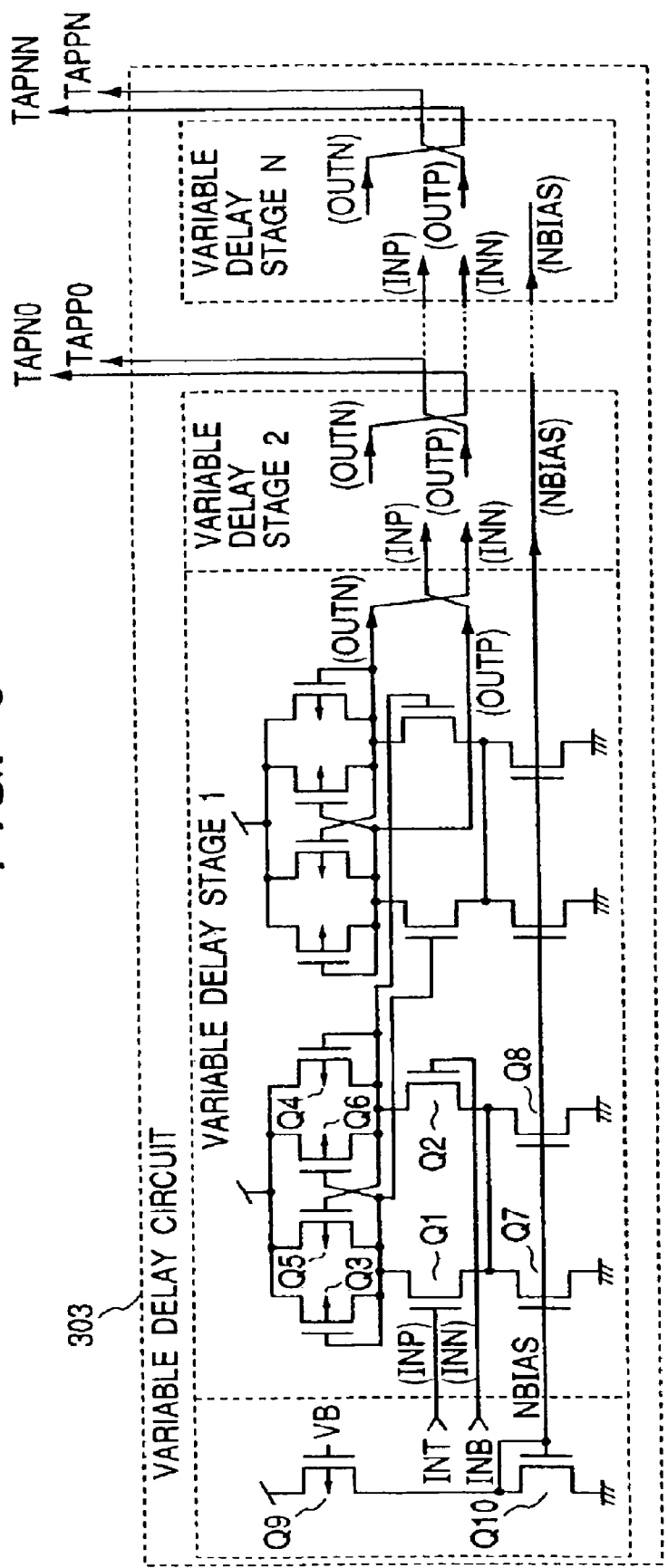
FIG. 8 is a circuit diagram illustrating a variable delay circuit included in the DLL analog unit according to the embodiment.

FIG. 8 is a diagram illustrating the variable delay circuit included in the DLL analog unit 3 according to the embodiment. The variable delay circuit 303 is constituted by a variable delay element and a bias circuit. A variable delay element has a constitution in which two differential inverters are connected in series, and varies the amount of delay by controlling the current of the current source based upon NBIAS. There has been shown a circuit of the two differential inverters. Described below is a circuit of the preceding stage to which the circuit marks are attached. N-channel MOSFETs Q7 and 08 are arranged in parallel between a common source of the n-channel differential MOSFETs Q1, Q2 and the ground potential of the circuit, to form a variable current source which changes the current based upon the NBIAS.

P-channel MOSFETs Q3 and Q4 which are diode-connected, are provided as a load circuit between the drains of the differential MOSFETS Q1, Q2 and the power-source voltage VDD. To steepen a change in the differential output signal, further, p-channel MOSFETs Q5 and Q6 of a latch form in which the gates and drains are connected to each other, are provided in parallel with the diode-connected MOSFETs Q3 and Q4. The drain outputs of the differential MOSFETs Q1 and Q2 are supplied to the gates of the differential MOSFETs as an input signal of the circuit of the next stage. The above two differential inverters are connected in cascade in plural stages to form the variable delay circuit 303. Among them, plural stages of from 0 to N from the final stage are provided with output taps TAPN0, TAPP0 to TAPNN, TAPPN. In the embodiment of FIG. 2, there are provided six output taps.

The bias circuit converts the control voltage VB into a current signal through a MOSFET Q9 and connects it to power-source MOSFETs in the differential inverters using a simple current mirror circuit. Here, however, a buffer circuit may be used for correcting the control voltage-delay amount characteristics. As described above, the variable delay circuit is provided with plural (e.g., six sets of) output taps. Among them, one output is selected to change the number of stages of the variable delay circuit.

Figure 9:
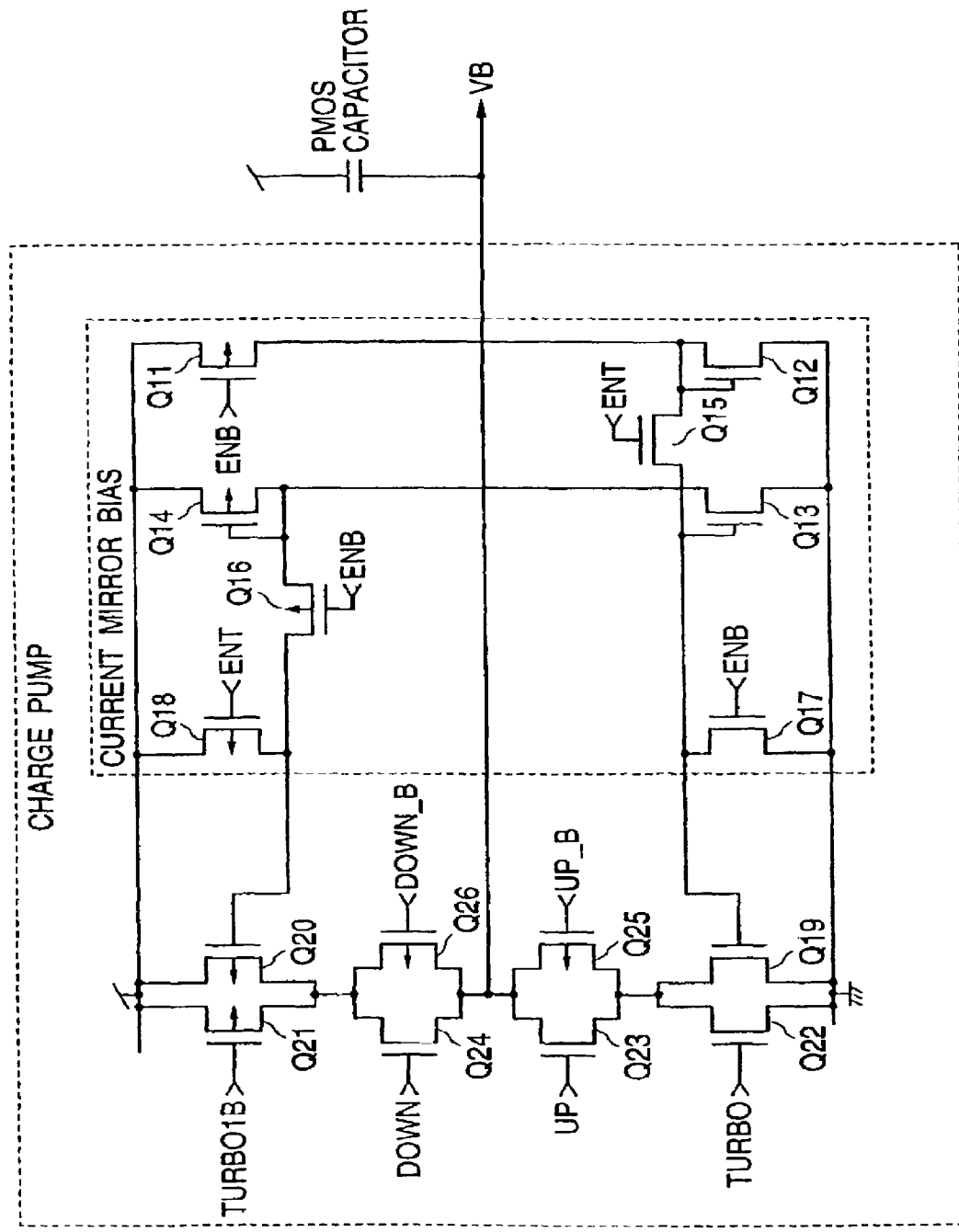
FIG. 9 is a circuit diagram illustrating a charge pump circuit included in the DLL analog unit according to the embodiment.

FIG. 9 is a diagram illustrating the charge pump circuit included in the DLL analog unit 3 according to the embodiment. In order to shorten the lock-in cycle of DLL, the charge pump circuit of this embodiment includes a current source for a small delay mode constituted by a p-channel MOSFET Q11 which is supplied with a signal ENB through the gate thereof, a current source for an intermediate delay mode constituted by an n-channel MOSFET Q22 supplied with a signal TURBO through the gate thereof, a current source for a large delay mode constituted by a p-channel MOSFET Q21 supplied with a signal TURBO1 through the gate thereof, current mirror biases Q12 to Q20 for transmitting the current of the current source for the small delay mode, and bidirectional switches Q23 to Q26.

In a state where the signal ENB has the high level, ENT has the low level and DLL is not in operation, the switching MOSFETs Q15 and Q16 are turned off, the switching MOSFETs Q17 and Q18 are turned on, the operation of the current source for the small delay mode is halted and the operation of the current mirror circuit is halted, to carry out the operation consuming a small amount of electric power. In this case, the MOSFETs Q22 and Q21 are turned off due to the signals TURBO and TURBO1B. The high-speed lock-in cycle operation using three current sources, i.e., current source for the small delay mode, current source for the intermediate delay mode and the current source for the large delay mode will be described later by using a diagram of waveforms.

Figure 10:
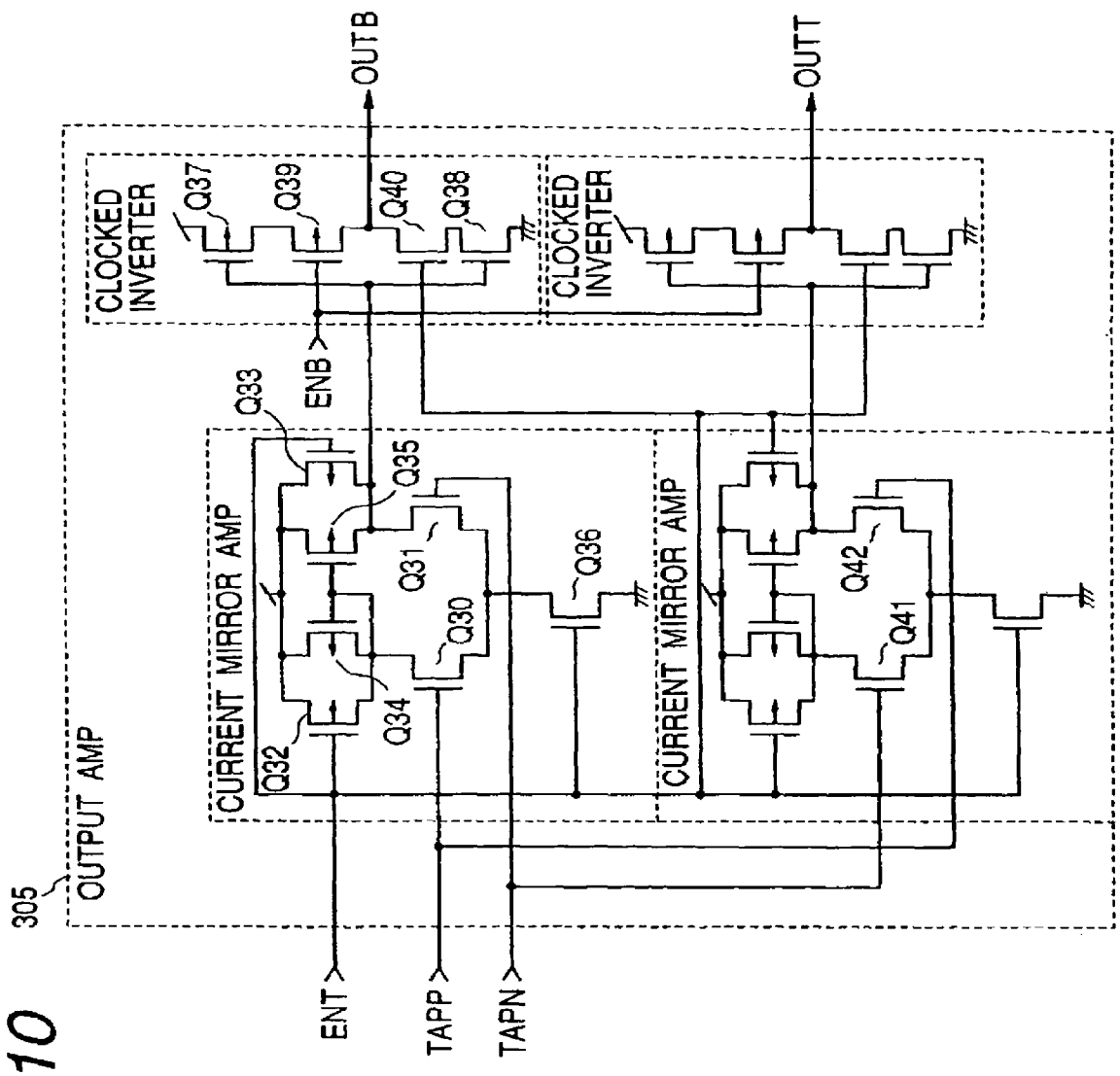
FIG. 10 is a circuit diagram illustrating an output amplifier included in the DLL analog unit according to the embodiment.

FIG. 10 is a circuit diagram illustrating an embodiment of the output amplifier included in the DLL analog unit 3. The output signal of the variable delay circuit using the differential inverter shown in FIG. 8 is small unlike that of VDD. Therefore, the amplitude must be amplified into a full amplification of the operation voltage like that of VDD. Therefore, an output amplifier 305 must be used. The output amplifier is constituted by two sets of a combination of a current mirror amplifier constituted by MOSFETs Q30 to Q35 and a clocked inverter constituted by MOSFETs Q37 to Q40. The current mirror amplifier operates when the control signals are ENT=VDD, ENB=0 (VSS or GND), and the output becomes valid. When ENT=0 and ENB=VCC, however, the current mirror amplifier does not operate and the output assumes a high impedance.

In FIG. 2, the outputs of the six output amplifiers are connected in common. Among the six output amplifiers, however, only one produces an effective output due to the signals ENT and ENB, and the number of stages of the variable delay circuit is changed over in addition to the signal amplification.

Figure 11:
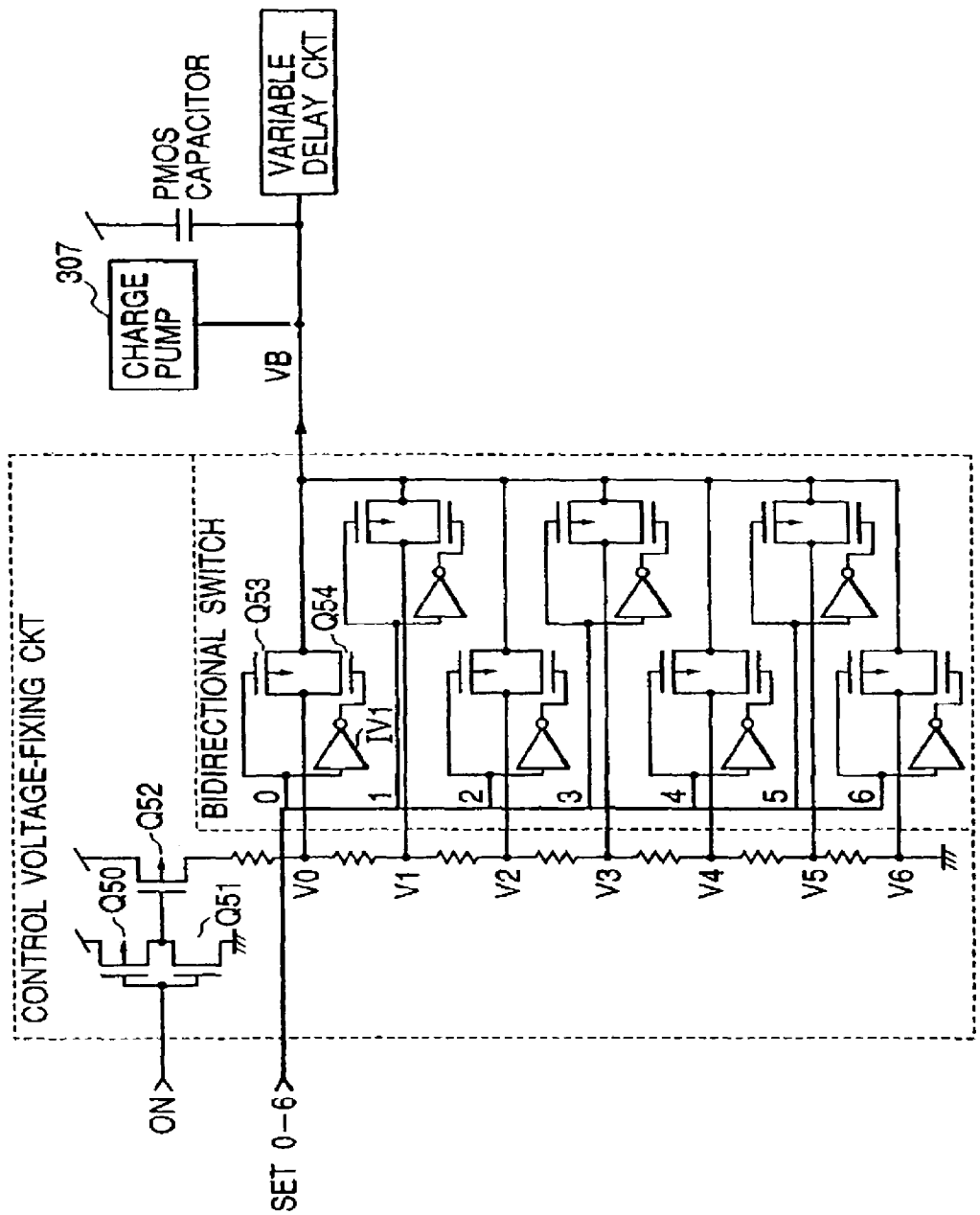
FIG. 11 is a circuit diagram illustrating a control voltage-fixing circuit included in the DLL analog circuit according to the embodiment.

FIG. 11 is a circuit diagram illustrating an embodiment of the control voltage-fixing circuit included in the DLL analog unit 3. A value of the control voltage must be given from an external unit at the time of measuring the control voltage-delay amount characteristics of the variable delay circuit. The control voltage must be fixed by using a probe from the external side. However, no bulky device is needed if the characteristics can be measured without probe. Besides, the measurement can be taken (packaging, mounting, etc.) to meet the practical conditions, and no noise enters through the probe.

The control voltage-fixing circuit is constituted by switching MOSFETs Q50 to Q52, voltage-dividing resistor circuit and bidirectional switch. When the signal ON becomes VDD, the MOSFET Q52 is turned on, a current flows into the series resistance circuit, and voltages V0 to V6 appear due to the division of voltage by the resistors. Among the signals SET0 to 6, only one is set to the high level like VDD, only one of the bidirectional switches is turned on, and the voltages V0 to V6 are connected to the control voltage VB to fix the control voltage VB relative to the variable delay circuit.

Figure 12:
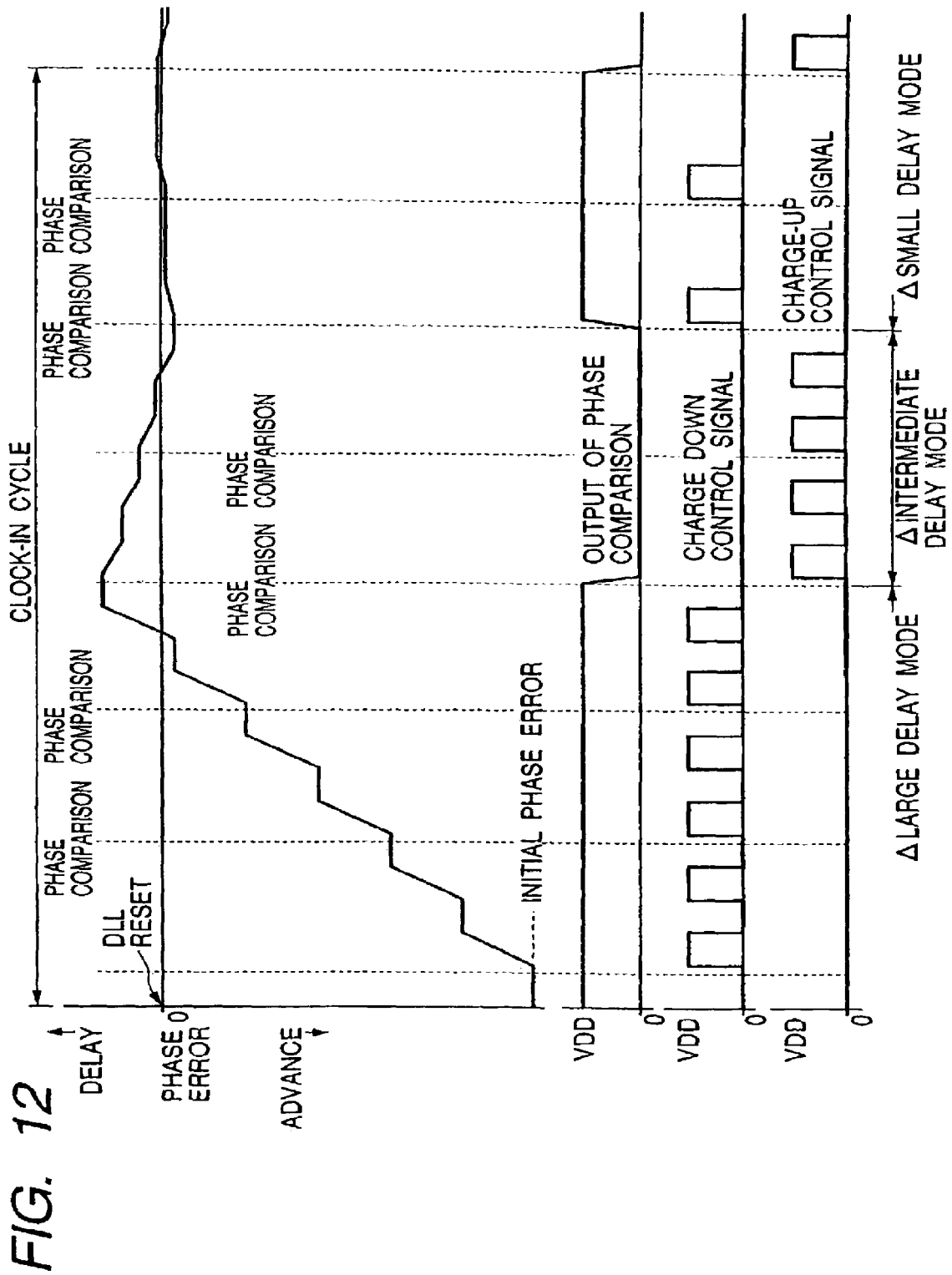
FIG. 12 is a diagram of waveforms illustrating the operation of the clock-generating circuit according to the invention.

FIG. 12 is a diagram of waveforms illustrating the operation of the clock-generating circuit according to the invention. When the DLL is reset, the initial phase error takes place on the advancing side. Therefore, a charge-down control starts in the large delay mode. In the large delay mode, the phase error is advancing and, hence, the output of the phase comparison assumes a high level, and two charge-up control signals are formed for one time of phase comparing operation. Due to the charge-up control signal, the phase error steeply changes toward the target value.

If described with reference to the circuit of FIG. 9, the signal TURBO1B assumes the low level, and the p-channel MOSFET Q21 is turned on to flow a large current. Accordingly, the n-channel MOSFET Q24 and the p-channel MOSFET Q26 are turned on due to the high level of down signal DOWN and the low level of DOWN_B, and the control voltage VB increases stepwise relative to the signals DOWN and DOWM_B. In response to the rise in the control voltage VB, the current formed by the P-channel MOSFET Q9 of FIG. 8 decreases, whereby the operation current of the differential inverter constituting the variable delay circuit decreases, the delay time increases, and the phase is changed toward the delay side.

When the phase error exceeds 0 which is a target value, the mode is changed over to the intermediate delay mode. In the large delay mode, the charge-down control operation only is executed. Therefore, the charge-up control operation only is executed in the intermediate delay mode. Accordingly, neither the charge-up current source for the large delay mode nor the charge-down current source for the intermediate delay mode has been provided unlike the embodiment of FIG. 9. Depending upon the manner of imparting the initial phase error, these two current sources may become necessary. In that case, these two current sources must be provided.

If described with reference to the circuit of FIG. 9, to correct the phase error that has increased in excess of delay error 0 due to the large delay mode, the signal TURBO assumes the high level, and the n-channel MOSFET Q22 is turned on to flow an intermediate current. To correct the delay, therefore, the output of phase comparison assumes the low level. Due to the high level of the up signal UP and low level of UP-B formed thereby, therefore, the N-channel MOSFET Q23 and the p-channel MOSFET Q25 are tuned on, to stepwisely decrease the control voltage VB in response to the signals UP and UP_B. In response to the drop in the control voltage VB, the current formed by the p-channel MOSFET Q9 of FIG. 8 increases, whereby the operation current of the differential inverter constituting the variable delay circuit increases, and the delay time decreases to correct a delay in the phase.

When the phase error exceeds 0 which is a target value due to the intermediate delay mode, the mode is changed over to the small delay mode. In the small delay mode, the charge-up control operation and the charge-down control operation based on a small current formed by the MOSFET Q11 are executed depending upon the output of phase comparison. In this case, two pulses (UP/DOWN) are not formed for the result of one time of phase comparison unlike the large delay mode or the intermediate delay mode but, instead, one pulse is generated. In the small delay mode, therefore, the error component for the phase error 0 is minimized.

In this embodiment, there exist current sources and bias circuits that are not required depending upon the mode such as large delay mode or intermediate delay mode. Therefore, the circuit is turned on and off by a signal TURBO, a signal TURBO_B, a signal TURBO1, a signal TURBO1_B, a signal ENT and a signal ENB. The signals have the following values in their respective modes. The power-off mode is the one for suppressing the consumption of electric current by halting the operation of the charge pump.

|  | TURBO | TURBO_B | TURBO1 | TURBO1_B | ENT | ENB |
|---|---|---|---|---|---|---|
| Large mode | VDD | 0 | VDD | 0 | VDD | 0 |
| Intermediate mode | VDD | 0 | 0 | VDD | VDD | 0 |
| Small mode | 0 | VDD | 0 | VDD | VDD | 0 |
| Off mode | 0 | VDD | 0 | VDD | 0 | VDD |

In the DLL of this embodiment, the initial phase error necessarily appears on the advancing side in order to minimize the delay time of the variable delay circuit immediately after it is reset. In order to quickly bring the initial phase error near to the phase error 0 immediately after the resetting, the large delay mode is assumed to increase the phase control amount delay from when the phases are compared until when the phases are compared next time. In order to increase the phase control quantity, further, the control operation is executed twice in addition to increasing the current of the charge pump. Since the initial phase error appears on the advancing side, the phase comparator produces an output of the high level such as VDD. When the control operation is executed several times in the large delay mode, the phase error over-shoots in excess of 0. The output of the phase comparator changes into 0 at a moment when the phases are compared next time after the over-shooting.

At this moment, the mode shifts from the large delay mode to the intermediate delay mode.

In the intermediate delay mode, the current of the charge pump is slightly squeezed but the number of times of control operation is not changed. When the control operation is executed several times in the intermediate delay mode, the phase error exceeds 0 again, which is the under-shooting. The output of the phase comparator changes into VDD at a moment when the phases are compared next time after the under-shooting. At this moment, the mode shifts from the intermediate delay mode to the small delay mode. In the small delay mode, the current of the charge pump is squeezed and the number of times of control operation is decreased to one time. Thus, the amount of delay control becomes a minimum through the phase comparison of one time. After the phase error has exceeded 0 in the small delay mode, the charge-down control signal and the charge-up control signal are output nearly alternatingly, and the phase error vibrates near 0. This state is a locked-in state. Therefore, if attention is given to the output waveforms only of the phase comparator, the period from when DLL is reset to when the output of the phase comparator has shifted from VDD to 0 twice becomes a lock-in cycle.

This embodiment deals with a new drive system for a charge pump in the analog control circuit. This system eliminates insensitive band which is a defect of PFD in the conventional drive system and shortens the lock-in cycle. The insensitive band is realized by a simple control method according to which the advance and delay only of the phase are judged by a phase comparator, the control voltage VB is changed as described above based upon the output of phase comparison, and the delaying amount is changed in the reverse direction at a moment when the target value which is the phase error 0 is exceeded. The insensitive band varies depending upon the performance of the transistors and the wiring lengths. Upon eliminating the insensitive band, therefore, it is allowed to easily design a circuit that is not affected by the process or the layout.

Figure 13:
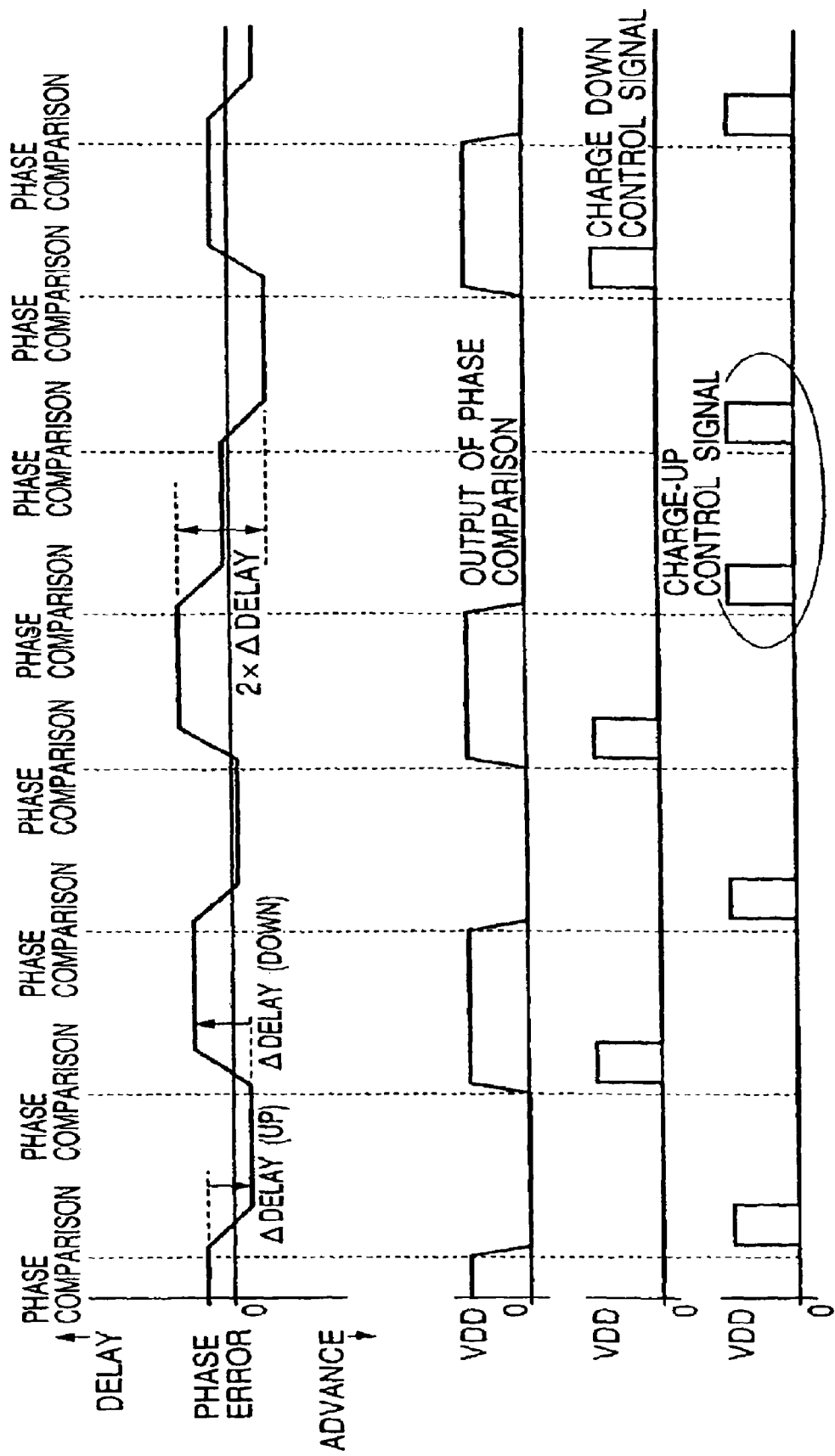
FIG. 13 is a diagram of waveforms illustrating the operation of the clock-generating circuit according to the invention.

FIG. 13 is a diagram of waveforms illustrating an example of operation of the clock-generating circuit according to the invention. In this embodiment, the lock-in takes place in a constant delay system. In FIG. 12, the charge-down control signal and the charge-up control signal were output nearly alternatingly. Since the charge pump is an analog circuit, it is not allowed to bring the charge-up amount and the charge-down amount into correct agreement with each other. Therefore, there exists a small amount of unbalance between the delay(down) and the delay(up) as shown. This unbalance causes an increase in the phase error with the passage of time and, finally, causes the control signal of one side to be output twice consecutively (production of control signals two times consecutively). The intensity of jittering becomes 2× delay. Though the diagramed embodiment has dealt with the case of delay(down) delay(up), the same holds even for the reverse case.

Figure 14:
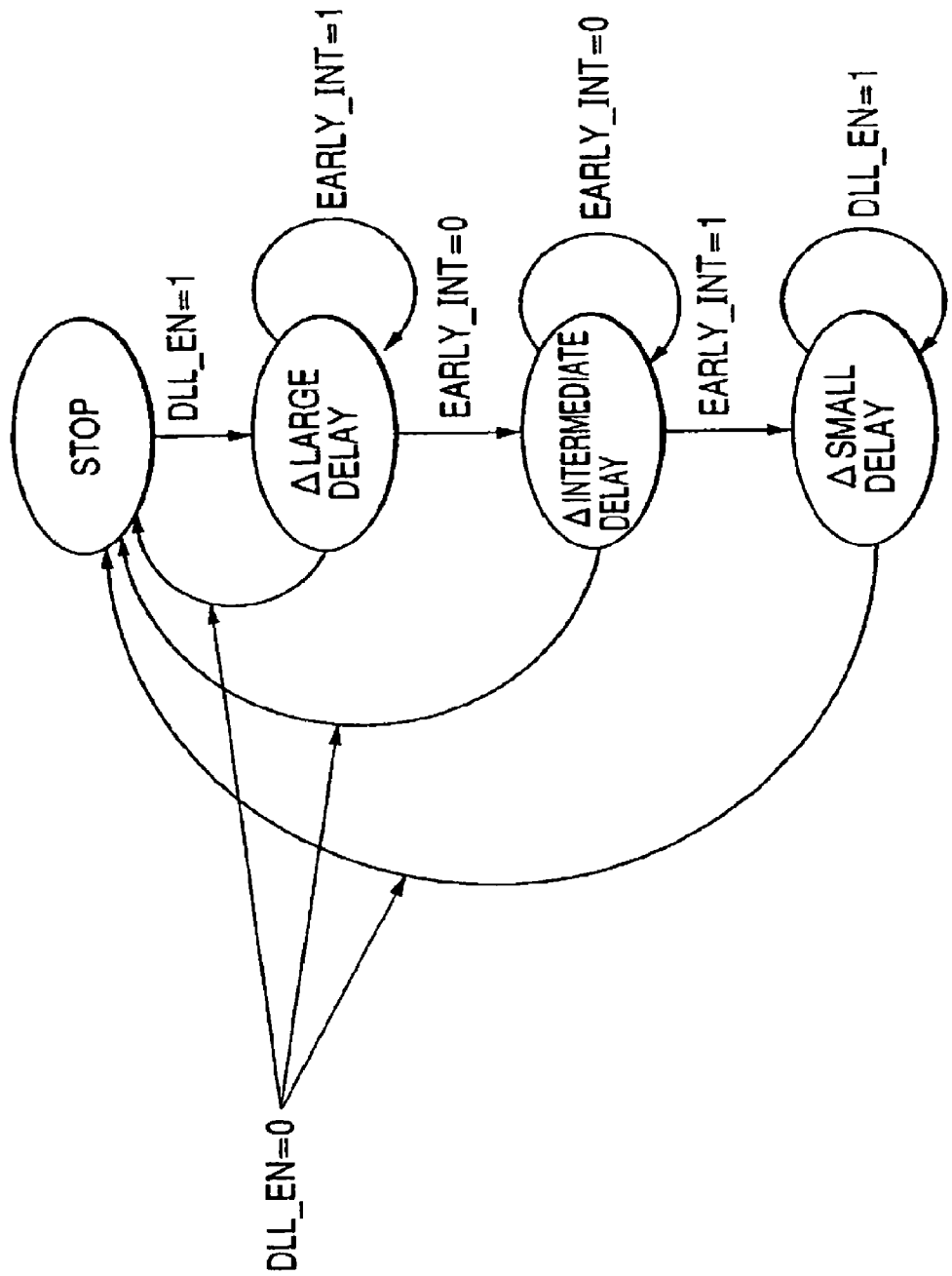
FIG. 14 is a diagram illustrating the transition of state of a state control circuit included in the clock-generating circuit according to the invention.

FIG. 14 is a diagram illustrating the transition of states of the state control circuit included in the clock-generating circuit according to the invention. The state control circuit 403 is included in the DLL digital circuit unit of FIG. 7 and forms signals TURBO and TURBO1 that are supplied to the DLL analog unit 3. In the case of DLL_EN=0 V (VSS), a state for halting the DLL is assumed. When DLL_EN=VDD, the following state control operation is executed while looking at a change in the phase comparison output EARLY_INT output from the phase comparator 402:

| ΔLarge delay mode | TURBO = VDD | TURBO1 = VDD |
| ΔIntermediate delay mode | TURBO = VDD | TURBO1 = 0 |
| ΔSmall delay mode | TURBO = 0 | TURBO1 = 0 |

Figure 15:
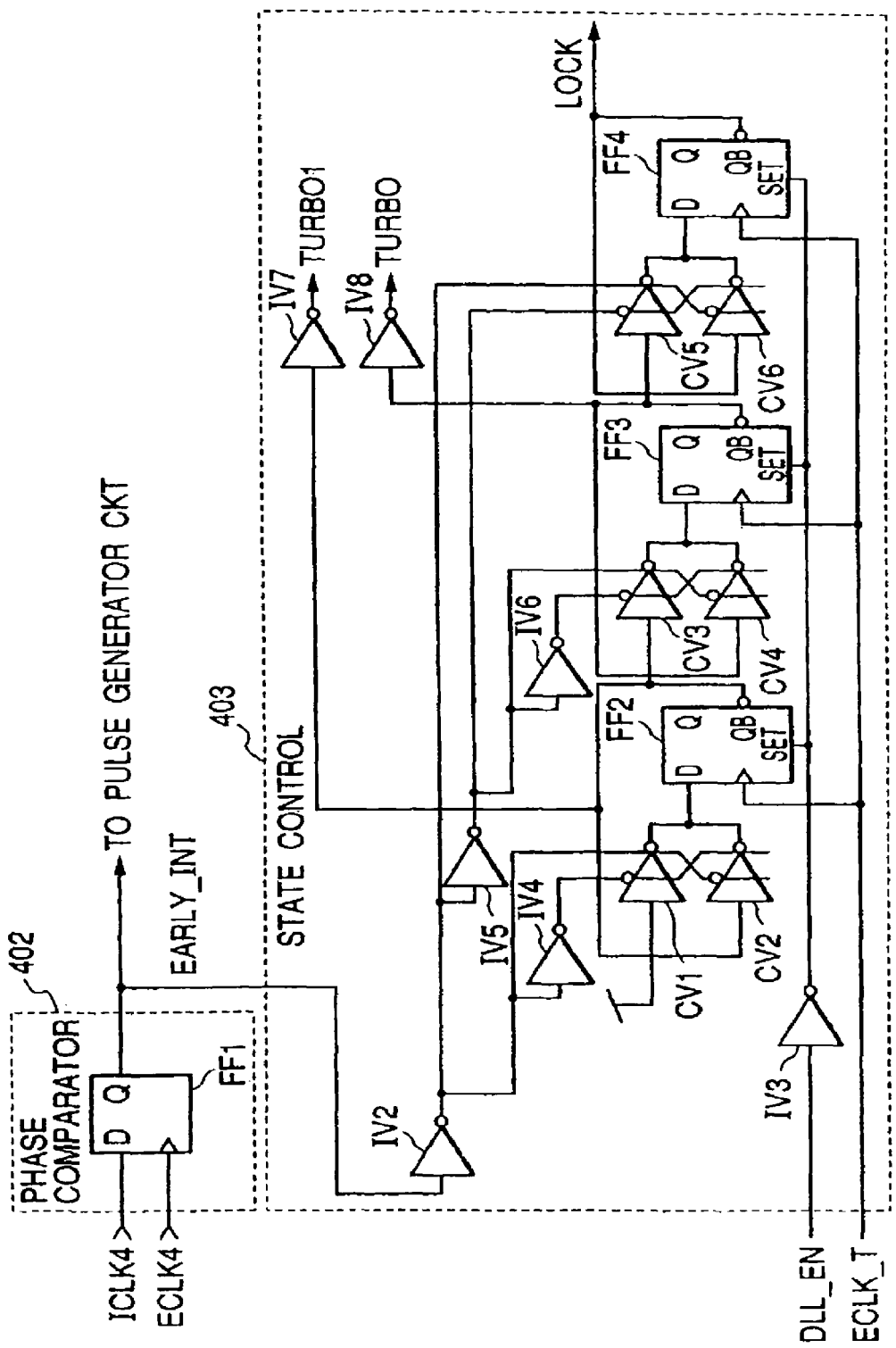
FIG. 15 is a circuit diagram illustrating a phase comparator in the DLL and the state control circuit according to the embodiment.

FIG. 15 is a circuit diagram illustrating the phase comparator and the state control circuit according to the embodiment. As shown, the phase comparator 402 may be a generally employed flip_flop circuit. The phase comparison output EARLY_INT becomes VDD when the internal clock signal ICLK4 rises earlier than the external clock signal ECLK4, and the phase comparison output EARLY-INT becomes 0 (low level) when the external clock signal ECLK4 rises earlier than the internal clock signal ICLK4.

The state control operation is such that when the signal DLL_EN is 0, all flip-flop circuits are set to VDD (high level). Thereafter, every time when EARLY_INT changes, the outputs Q of the flip-flop circuits FF2 to FF4 become 0, successively, to produce signals TURBO and TURBO1. When the final signal LOCK becomes VDD, it can be judged that DLL has shifted into the locked state.

Figure 16:
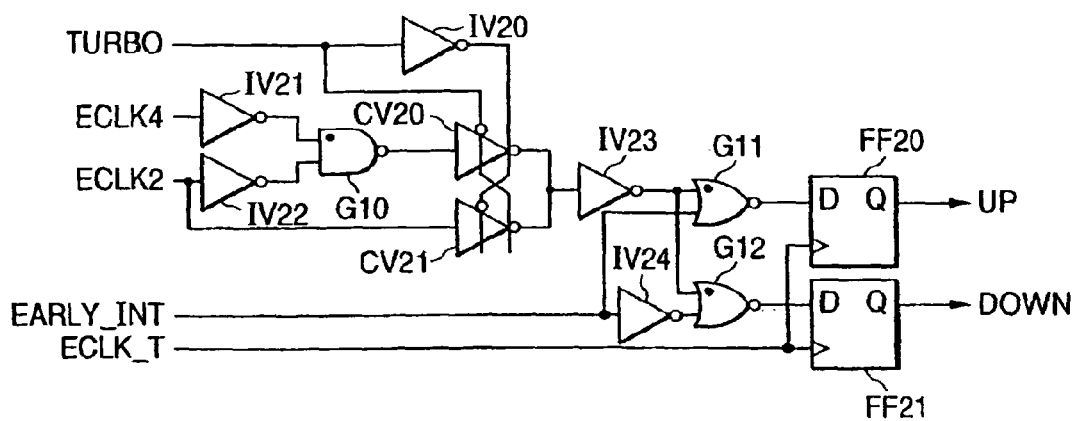
FIG. 16 is a circuit diagram illustrating a pulse-generating circuit in the DLL according to the embodiment.

FIG. 16 is a diagram illustrating an embodiment of the pulse-generating circuit. The pulse-generating circuit 404 generates signals UP and DOWN based upon the phase comparison output EARLY-INT. The pulse-generating circuit 404 is capable of producing pulses maintaining a stable pulse width upon maintaining synchronism with ECLK_T but is not capable of producing pulses shorter than the clock period. The ECLK2 is a signal obtained by dividing the frequency of ECLK_T by two.

Figure 17:
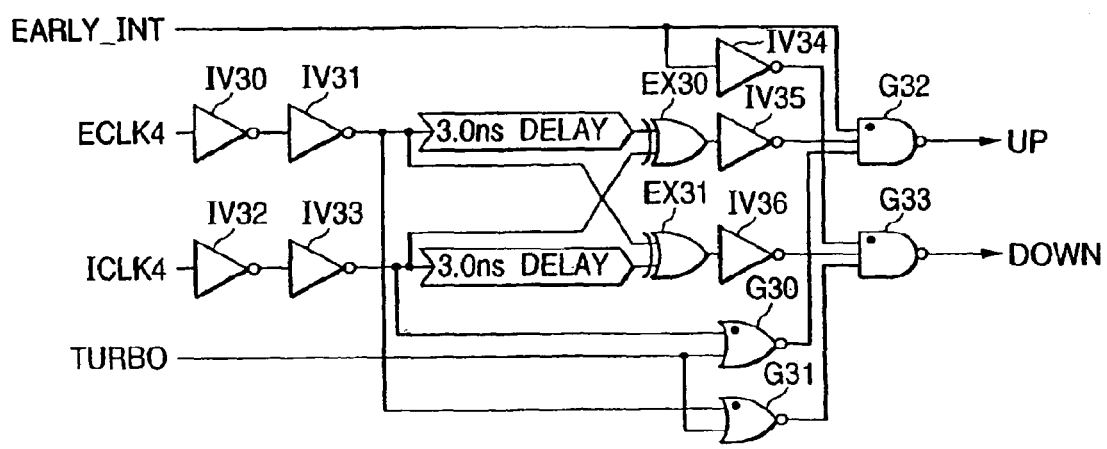
FIG. 17 is a circuit diagram illustrating a pulse-generating circuit in the DLL according to another embodiment.

FIG. 17 is a diagram illustrating the pulse-generating circuit according to another embodiment. In this embodiment, a delay circuit is used to produce pulses of any desired width. When the width of the pulse is too narrow, the initial phase error is drawn being lagged behind. Therefore, the pulse width is set to be "phase difference+3.0 ns". In the pulse-generating circuit of this embodiment, delay is not constant. However, what is important in controlling the delay to be constant is that delay 0 even at a point of phase difference=0, and there exists no problem.

Figure 18:
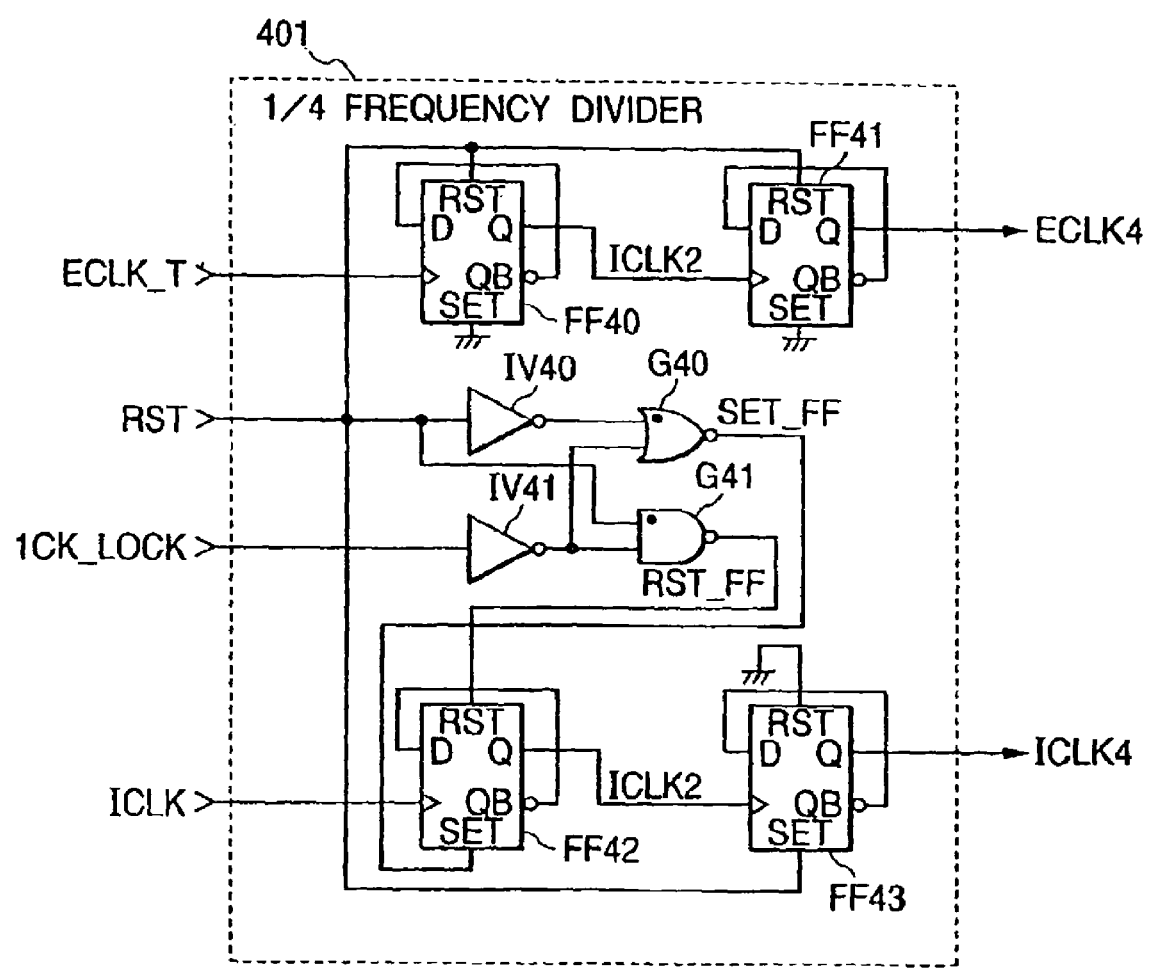
FIG. 18 is a circuit diagram illustrating a ¼ frequency divider in the DLL.

FIG. 18 is a diagram illustrating an embodiment of the ¼ frequency divider circuit. The ¼ frequency divider circuit of this embodiment is the 1 ck lock-2 ck lock change-over type. The DLL of this embodiment employs 2 ck lock. Therefore, the frequencies of ECLK_T and ICLK must be divided into one-fourth prior to comparing the phases, in order to prevent harmonic lock. Therefore, when the ECLK_T and ICLK have the same phases, the circuit is so reset that the phase of ICLK4 is in advance of ECLK4 by 720 degrees.

Thereafter, the variable delay circuit and the replica circuit (replica delay) work to delay the phase of ICLK by 720 degrees (2 ck), so that ECLK 4 and ICLK4 are in phase and are locked together. When the phase of the ICLK4 is advancing by 360 degrees instead of 720 degrees, 1 ck locking is effected. It is thus allowed to effect the 1 ck locking and 2 ck locking using one circuit. Unlike the general flip-flop circuit, the flip-flop circuit used for the ¼ frequency divider is provided with both a set terminal and a reset terminal. Due to the signal 1 CK_LOCK, the phase can be changed right after the reset signal has broken. Described below are changes in the phase right after the resetting due to changes in the 1 CK_LOCK.

| Value of CK_LOCK | Phase of ECLK4 | Phase of ICLK4 |
| --- | --- | --- |
| 0 | 0° | −720° |
| 1 | 0° | −360° |

Figure 19:
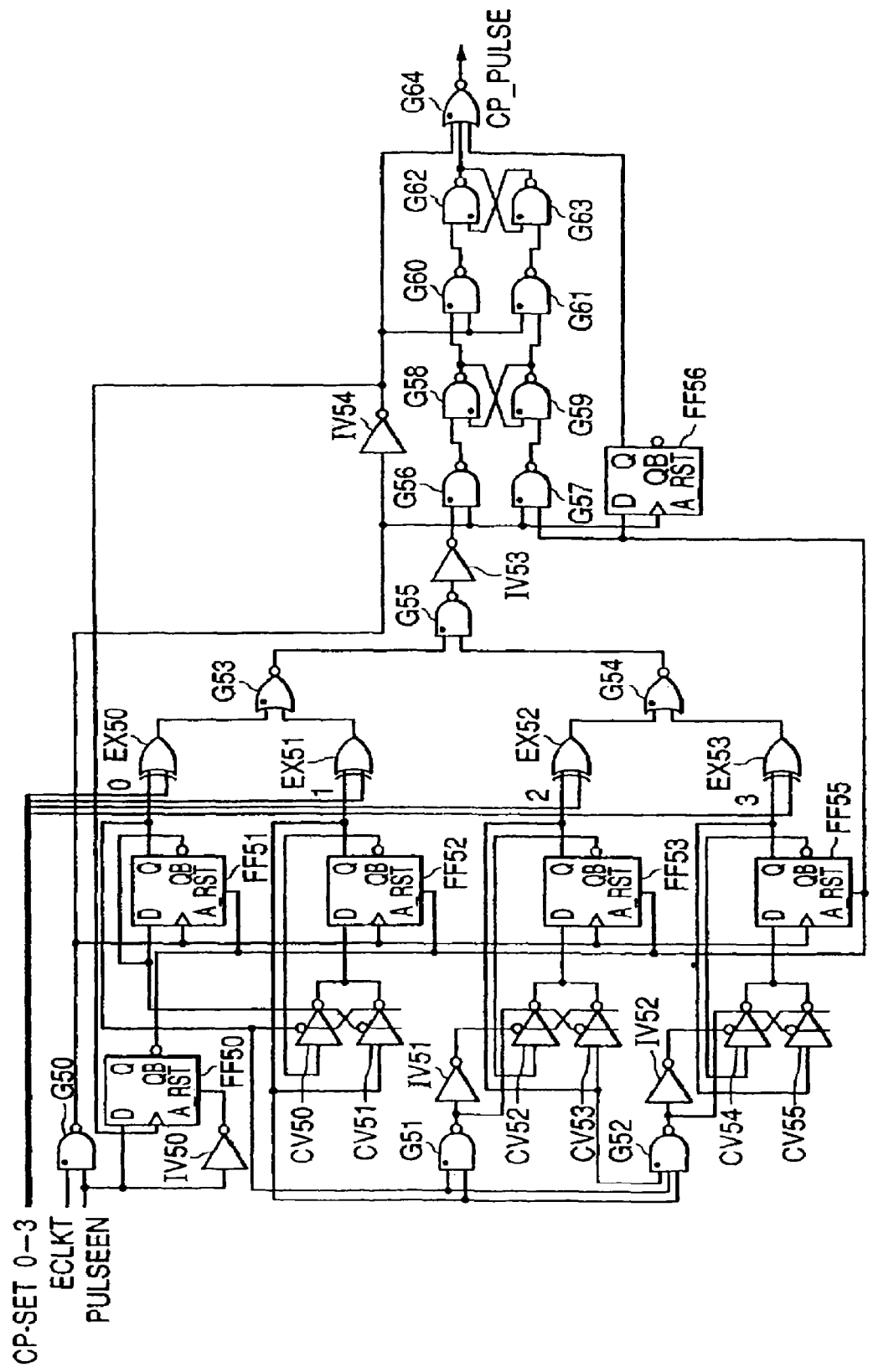
FIG. 19 is a circuit diagram illustrating a charge pump test pulse-generating circuit in the DLL according to the embodiment.

FIG. 19 is a diagram illustrating an embodiment of the charge pump test pulse-generating circuit. The DLL of the analog control system makes it difficult to test the state of the internal circuit from the outer side compared to that of the digital control system. The operation of the charge pump is one of the difficulties. The pulse-generating circuit is necessary for testing to what extent the delay amount of the variable delay circuit changes when the charge pump is operated one time. The charge pump test pulse-generating circuit produces pulses CP-PULSE (having a width of tCK/2) of a number set by CP-SET0-3. Upon operating the charge pump with these pulses, it is allowed to test the operation of the charge pump by the externally set CP-SET0-3. The pulse CP-PULSE is produced as the signal PULSEEN assumes the high level.

Figure 20:
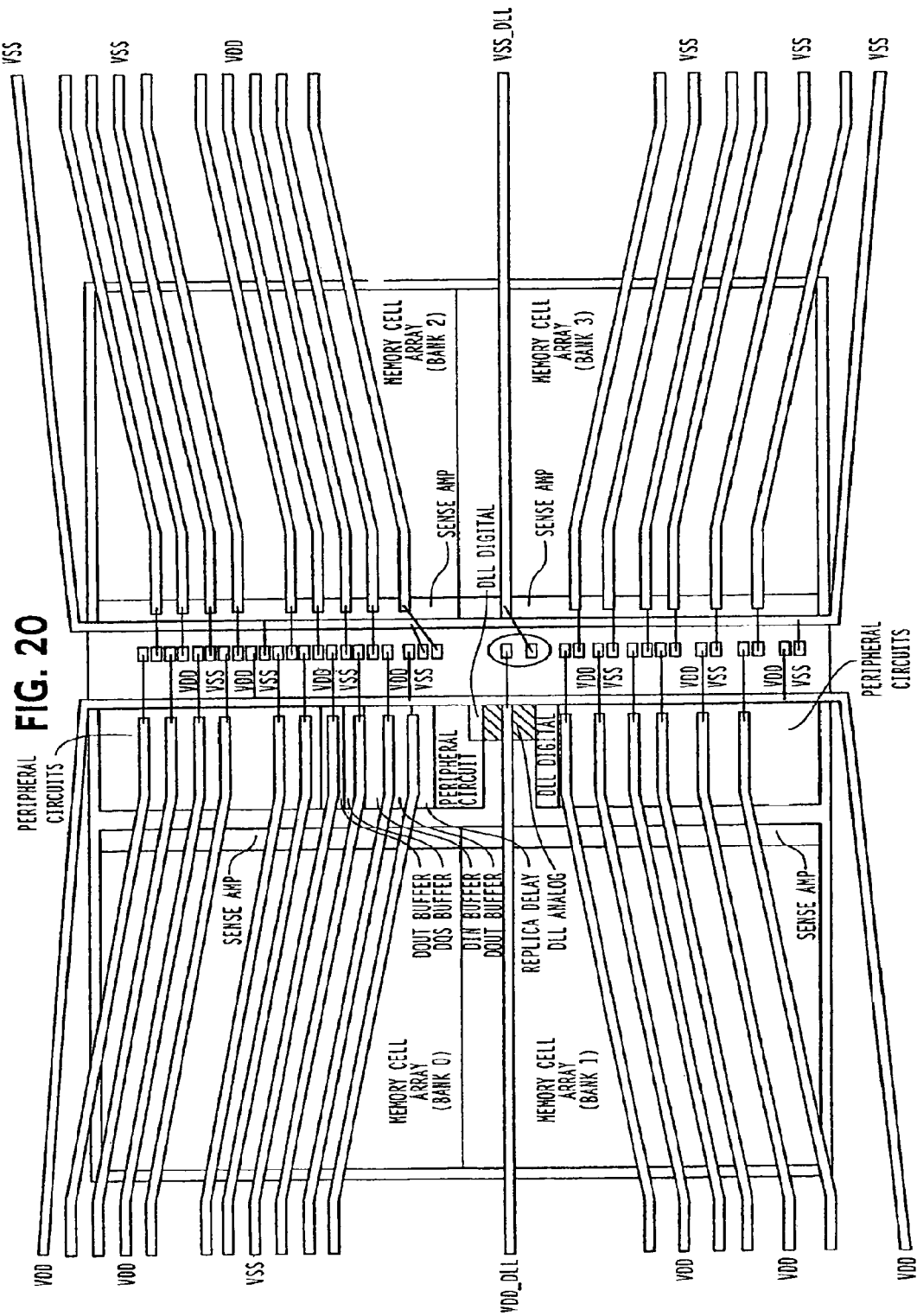
FIG. 20 is a plan view illustrating a relationship between the memory chip and the lead frame in the semiconductor integrated circuit device according to the invention.

FIG. 20 is a plan view illustrating a relationship between the memory chip and the lead frame in the semiconductor integrated circuit device according to an embodiment of the invention. The memory chip has several VDD and VSS pads, and VDD_DLL and VSS_DLL are among them. However, dedicated bonding pads and lead frames are assigned to VDD_DLL and VSS_DLL to prevent the infiltration of noise from the power source wiring.

Figure 21:
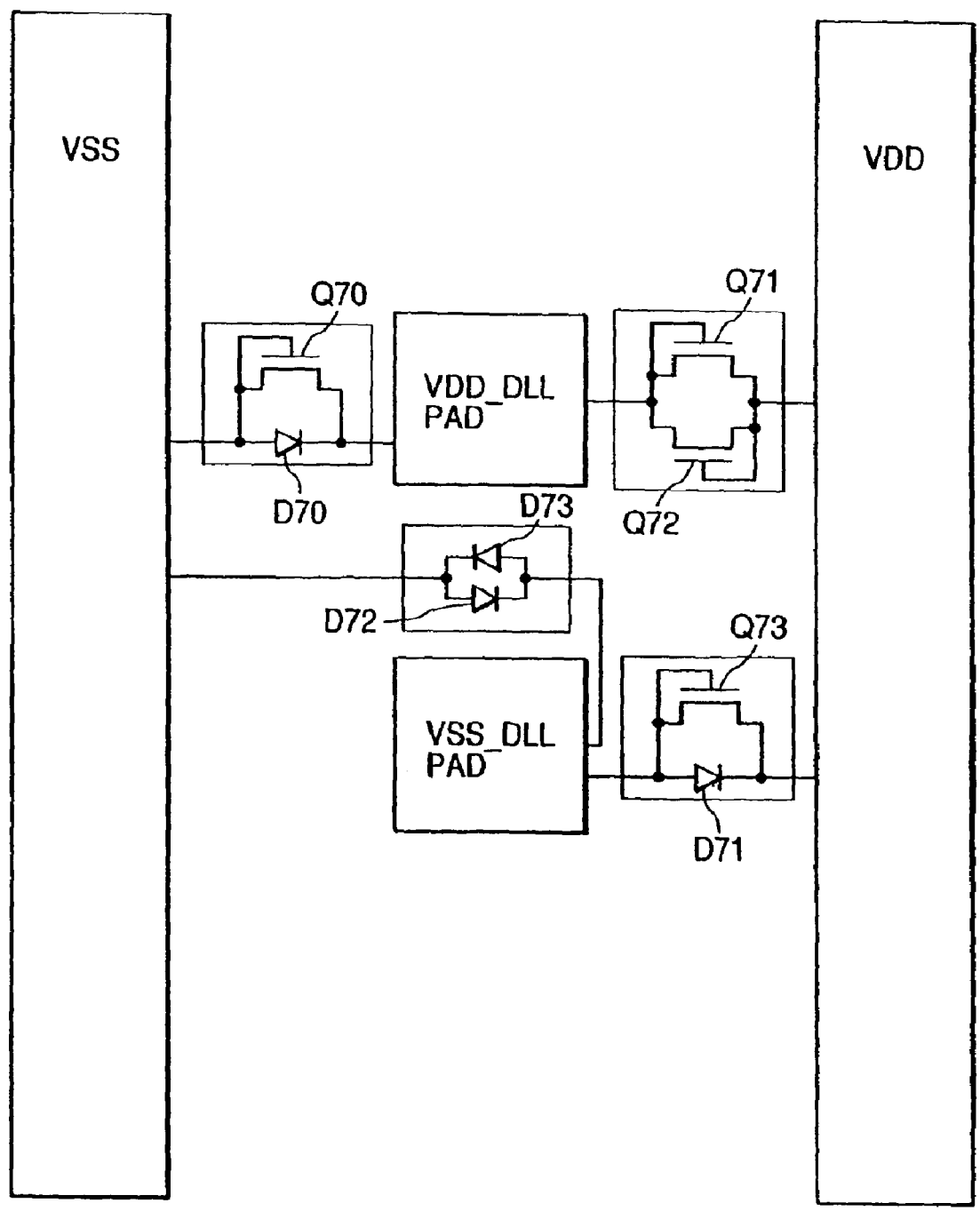
FIG. 21 is a circuit diagram illustrating an electrostatic protection circuit in the semiconductor integrated circuit device according to the embodiment of the invention.

FIG. 21 is a diagram of an electrostatic protection circuit in the semiconductor integrated circuit device according to the embodiment of the invention. In this embodiment, provision is made of the dedicated pads VDD_DLL and VSS_DLL for applying operation voltages to the DLL of the variable delay circuit. The dedicated pads VDD_DLL and VSS_DLL are provided with the following elements to cope with ESD.

A diode D70 and a diode-connected MOSFET Q70 are connected in parallel between the pad VDD_DLL and the VSS wiring, and diode-connected MOSFETs Q71 and Q72 are connected in parallel between the pad VDD_DLL and the wiring VDD. Similarly, diodes D72 and D73 are connected in parallel between the pad VSS_DLL and the wiring VSS, and a diode connected MOSFET Q73 and a diode D71 are connected in parallel between the pad VSS_DLL and the wiring VDD.

As described above, the semiconductor integrated circuit device is provided with an electrostatic protection circuit to prevent the internal elements from being broken down by the static electricity generated during the handling such as transportation or assembling of the device. Therefore, the power source pads VDD_DLL and VSS_DLL that are independently formed as described above, are electrically connected, via the electrostatic protection circuit, to the VDD and VSS that supply operation voltages to other internal circuits in a broad sense or in theory.

In a state where the semiconductor integrated circuit device is ordinarily operated, however, no current flows into the electrostatic protection circuit, and it cannot be said that it is in an electrically connected state. That is, the power-source noise generated in VDD and VSS and fluctuation in the voltage are not transmitted to VDD_DLL or VSS_DLL. From the standpoint of operation of the clock-generating circuit of the invention, therefore, it can be said that VDD and VSS are electrically isolated from VDD_DLL and VSS_DLL.

Described below are the actions and effects obtained from the above embodiment.

(1) A semiconductor integrated circuit device having a clock-generating circuit that includes a control circuit for forming internal clock signals by comparing a signal obtained by delaying, through a variable delay circuit, an input clock signal input through an external terminal with the input clock signal, and so controlling the delay time of the variable delay circuit that they are brought into agreement with each other, wherein in the clock-generating circuit, the element-forming region constituting the variable delay circuit and the circuit for forming the delay control signals is electrically isolated from the element-forming region constituting the digital circuit on the same semiconductor substrate relying upon the element isolation technology, in order to realize a highly precise phase synchronization based on a stable delaying operation without affected by a change in the substrate potential caused by the operation of the digital circuit.

(2) In addition to the above, the device is realized through a simple production process in which the circuits such as variable delay circuit and charge pump circuit are formed on a triple well, i.e., on a well region of a second type of electric conduction that is deeply formed, and on a well region of a first type of electric conduction or of the second type of electric conduction shallowly formed on a common semiconductor substrate of the first type of electric conduction, establishing an element isolation technology.

(3) In addition to the above, the variable delay circuit and the charge pump circuit are operated on an operation voltage via dedicated bonding pads and leads different from the power-source terminals for supplying the operation voltages to the digital circuits, in order to realize a high degree of precision based on the stable delay operation of the variable delay circuit affected by neither the power-source passage nor a fluctuation in the voltage.

(4) In addition to the above, a MOS capacitor element is formed in the periphery of the well region of the second type of electric conduction that is deeply formed, and is used for stabilizing the operation voltage. This makes it possible to absorb noise transmitted through the common power source feeder line on the side of the substrate mounting the semiconductor integrated circuit device and, hence, to realize a high degree of precision based on the stable delay operation of the variable delay circuit.

(5) In addition to the above, provision is further made of a clock input buffer for receiving input clock signals that are fed to the variable delay circuit and a clock output buffer for producing delay signals, the clock input buffer and the clock output buffer being formed on the well region of the second type of electric conduction that is deeply formed. Therefore, the variable delay circuit and the delay control signal thereof are not affected by noise included in the signal transmission passages, and a high degree of precision is realized based on the stable delay operation of the variable delay circuit.

(6) In addition to the above, a first frequency-dividing circuit for dividing the frequency of the input clock signals is reset at the start of operation of the clock-generating circuit, and a second frequency-dividing circuit for dividing the frequency of the internal clock signals selects either a clock signal delayed by two clocks or a clock signal delayed by one clock behind the external clock that is in phase upon selectively giving a predetermined initial value.

(7) In addition to the above, the first and second frequency-dividing circuits, the replica delay circuit and the phase comparator circuit are formed in an element-forming region electrically isolated from the element-forming region where the variable delay circuit and a circuit for forming delay control signals are formed. This prevents power-source noise generated in the digital circuit operating with its full amplitude from being transmitted to the analog circuit unit, and a high degree of precision is realized based on the stable delay operation of the variable delay circuit.

(8) In addition to the above, the clock-generating circuit is mounted on a dynamic RAM which includes plural word lines connected to the address selection terminals of plural dynamic memory cells, plural pairs of complementary bit lines connected to plural dynamic memory cells, and sense amplifiers constituted by plural latch circuits that are served with an operation voltage corresponding to the operation timing signals to amplify signals of the pairs of bit lines, wherein the variable delay circuit constituting the clock-generating circuit and a circuit for forming the delay control signals thereof are supplied with operation voltages through dedicated bonding pads and leads different from the power-source terminals for supplying the operation voltages to the sense amplifier, in order to realize a high degree of precision based on the stable delay operation of the variable delay circuit without affected by large noise from the sense amplifier.

(9) A semiconductor integrated circuit device having a clock-generating circuit that includes a control circuit for forming internal clock signals by comparing a signal obtained by delaying, through a variable delay circuit, an input clock signal input through an external terminal with the input clock signal, and so controlling the delay time of the variable delay circuit that they are brought into agreement with each other, wherein in the clock-generating circuit, at least the variable delay circuit is supplied with an operation voltage through dedicated bonding pads and leads different from the operation voltage feed passage of the digital circuit formed on the same substrate, in order to realize a highly precise phase synchronization based on a stable delaying operation without affected by a change in the power-source voltage caused by the operation of the digital circuit.

(10) In addition to the above, the clock-generating circuit is mounted on a dynamic RAM which includes plural word lines connected to the address selection terminals of plural dynamic memory cells, plural pairs of complementary bit lines connected to plural dynamic memory cells, and sense amplifiers constituted by plural latch circuits that are served with an operation voltage corresponding to the operation timing signals to amplify signals of the pairs of bit lines, wherein the variable delay circuit constituting the clock-generating circuit is supplied with an operation voltage through dedicated bonding pads and leads different from the power-source terminals for supplying the operation voltages to the sense amplifier, in order to realize a high degree of precision based on the stable delay operation of the variable delay circuit without affected by large noise from the sense amplifier.

(11) In addition to the above, the digital circuit is provided with an input circuit for receiving input signals supplied through an external terminal and an output circuit for sending output signals to the external terminal, the input circuit and the output circuit are supplied with operation voltages through dedicated bonding pads and leads different from the power-source terminals for supplying the operation voltages to the clock-generating circuit and to the sense amplifier, in order to accomplish stable delaying operation of the variable delay circuit and sense amplifier operation without permitting the clock-generating circuit and the sense amplifier to be affected by large noise from the output circuit.

(12) Provision is made of a clock-generating circuit that includes a control circuit for forming internal clock signals by comparing a signal obtained by delaying, through a variable delay circuit, an input clock signal input through an external terminal with the input clock signal, and so controlling the delay time of the variable delay circuit that they are brought into agreement with each other, wherein the control circuit controls the variable delay circuit so as to return the delaying amount in the reverse direction at a moment when the variable delay time has exceeded a target value. This eliminates the insensitive band that is the defect of PFD of the conventional drive system. Upon eliminating such an insensitive band, the phase difference is not affected by the performance of the transistors or by the wiring lengths, facilitating the designing.

(13) In addition to the above, the amount of change in the delay time of the variable delay circuit is set nearly constant by the phase comparator circuit for every phase comparing operation, making it possible to suppress the error of phase to two folds at the greatest in the locked-in state.

(14) Upon varying the amount of change in the delay time of the variable delay circuit by the phase comparator circuit for every phase comparing operation depending upon the operation conditions, it is allowed to realize an optimum response and stability depending upon the operation conditions.

(15) In addition to the above, the amount of change in the delay time of the variable delay circuit is set to be large during a first period of from the start of operation of the clock-generating circuit until the target value is exceeded, is set to be smaller than the amount of change in the delay time in the first period during a second period of from the first period until when the delay time becomes smaller than the target value, and is set to be smaller than that in the second period after the second period. This makes it possible to stabilize the operation in the locked-in state while shortening the lock-in cycle from the start of DLL operation until locking-in.

(16) In addition to the above, the amount of change in the delay time of the variable delay circuit decreases every time when the delay time of the variable delay circuit exceeds a target value within a range in which the phase-synchronizing operation is not lost. This makes it possible to stabilize the operation in the locked-in state while improving the response characteristics.

(17) In addition to the above, the phase comparator circuit forms a phase comparison signal of a high level or a low level in response to the phase difference, and forms a pulse signal for flowing a charge-up current or a discharge current to the charge pump circuit in response to the phase comparison signal. This makes it possible to change over the response depending upon the pulse output from the pulse-generating circuit yet simplifying the circuit.

(18) In addition to the above, the amount of delay time of the variable delay circuit can be flexibly varied based on the combination of the number of pulse signals and the charge current of the charge pump circuit that varies depending upon the pulse signals, by using a simple circuit to realize a desired response maintaining stability in the operation.

In the foregoing was concretely described the invention accomplished by the present inventors by way of embodiments. It should, however, be noted that the invention of this application is in no limited to the above embodiments only but can be changed in a variety of other ways without departing from the gist of the invention. For example, the DLL may be a digital control digital DLL or a digital control analog DLL. Even in the variable delay circuit of these DLL, the voltage supplied to the gate of the MOSFET changes with a change in the power source voltage whereby a current that flows undergoes a change. As the substrate voltage changes, further, the threshold voltage of the MOSFET changes depending upon the substrate effect causing the drain current to change. Upon applying the present invention, therefore, a variable delay circuit constituting the DLL is realized and control signals thereof are stabilized, suppressing the jittering in the clock signals that are output.

The technology for electrically isolating the variable delay circuit constituting the DLL and the circuit for forming the control signals therefor, may be the one that utilizes the SOI (silicon-on-insulator) structure.

Accompanying an increase in the operation speed of the semiconductor integrated circuit device, the frequency of the clock signals is ever increasing and the period of a clock is becoming ever short. Therefore, decreasing the jittering which is the fluctuation in the phase of the clock signals results in a reduction in the time margin included in the period of one clock, which is very advantageous for increasing the frequency of the clock signals.

The clock-generating circuit of the invention can be extensively used for a variety of digital semiconductor integrated circuit devices that mount a clock-generating circuit (or reproducing circuit) and has synchronous inputs and outputs, in addition to the synchronous DRAM described earlier.

Briefly described below are the effects obtained by the representative examples of the invention disclosed in this application. A semiconductor integrated circuit device having a clock-generating circuit that includes a control circuit for forming internal clock signals by comparing a signal obtained by delaying, through a variable delay circuit, an input clock signal input through an external terminal with the input clock signal, and so controlling the delay time of the variable delay circuit that they are brought into agreement with each other, wherein in the clock-generating circuit, the element-forming region constituting the variable delay circuit and the circuit for forming the delay control signals is electrically isolated from the element-forming region constituting the digital circuit on the same semiconductor substrate relying upon the element isolation technology, in order to realize a highly precise phase synchronization based on a stable delaying operation without affected by a change in the substrate potential caused by the operation of the digital circuit.

A semiconductor integrated circuit device having a clock-generating circuit that includes a control circuit for forming internal clock signals by comparing a signal obtained by delaying, through a variable delay circuit, an input clock signal input through an external terminal with the input clock signal, and so controlling the delay time of the variable delay circuit that they are brought into agreement with each other, wherein in the clock-generating circuit, at least the variable delay circuit is supplied with an operation voltage through dedicated bonding pads and leads different from the operation voltage feed passage of the digital circuit formed on the same substrate, in order to realize a highly precise phase synchronization based on a stable delaying operation without affected by a change in the power-source voltage caused by the operation of the digital circuit.

Provision is made of a clock-generating circuit that includes a control circuit for forming internal clock signals by comparing a signal obtained by delaying, through a variable delay circuit, an input clock signal input through an external terminal with the input clock signal, and so controlling the delay time of the variable delay circuit that they are brought into agreement with each other, wherein the control circuit controls the variable delay circuit so as to return the delaying amount in the reverse direction at a moment when the variable delay time has exceeded a target value. This eliminates the insensitive band that is the defect of PFD of the conventional drive system. Upon eliminating such an insensitive band, the phase difference is not affected by the performance of the transistors or by the wiring lengths, facilitating the designing.

We claim:

1. A double data ratio synchronous type dynamic random access memory, comprising:
a semiconductor chip having a clock generating circuit and an internal circuit whose operation is controlled by clock signals from the clock generating circuit,
wherein the internal circuit comprises:
a plurality of word lines;
a plurality of data lines;
a plurality of dynamic type memory cells which are coupled to the plurality of word lines and the plurality of data lines;
a plurality of sense amplifiers each of which is coupled to the plurality of data lines;
a data signal output circuit which is coupled to the plurality of sense amplifiers and outputs data signals to outside of the double data ratio synchronous type dynamic random access memory from the plurality of dynamic type memory cells in synchronism with rising and falling of clock signals generated by the clock generating circuit; and
a data strobe signal output circuit which is operated in response to clock signals from the clock generating circuit and which is synchronized with data signals from the data signal output circuit,
wherein the clock generating circuit comprises:
a delay circuit which receives first clock signals and generates second clock signals by delaying the first clock signals for predetermined time;
a phase comparing circuit which compares a phase of the first clock signals and a phase of third clock signals based on the second clock signals and generates control signals; and
a control circuit which controls the delay circuit for coinciding the phase of the first clock signals and the third clock signals in accordance with the control signals,
wherein the semiconductor chip comprises:
a first power source pad for supplying a first power source voltage to the delay circuit;
a second power source pad for supplying a second power source voltage which is lower than the first power source voltage to the delay circuit;
a third power source pad for supplying a third power source voltage to the data signal output circuit; and
a fourth power source pad for supplying a fourth power source voltage which is lower than the third power source voltage to the data signal output circuit,
wherein the double data ratio synchronous type dynamic random access memory includes:
a first terminal which is coupled to the first power source pad;
a second terminal which is coupled to the second power source pad;
a third terminal which is coupled to the third power source pad and which is different from the first terminal;
and a fourth terminal which is coupled to the fourth power source pad and which is different from the second terminal,
wherein a first path for supplying power to the delay circuit includes the first terminal, the first power source pad, the second terminal and the second power source pad,
wherein a second path for supplying power to the internal circuit includes the third terminal, the third power source pad, the fourth terminal and the fourth power source pad and wherein the second path is different from the first path.

2. A double data ratio synchronous type dynamic random access memory according to claim 1,
wherein the first terminal is coupled with the first power source pad via first bonding wire,
wherein the second terminal is coupled with the second power source pad via second bonding wire,
wherein the third terminal is coupled with the third power source pad via third bonding wire, and
wherein the fourth terminal is coupled with the fourth power source pad via fourth bonding wire.

3. A double data ratio synchronous type dynamic random access memory, comprising:
a semiconductor chip having a clock generating circuit and an internal circuit whose operation is controlled by clock signals from the clock generating circuit,
wherein the internal circuit comprises:
a plurality of word lines;
a plurality of data lines;

a plurality of dynamic type memory cells which are coupled to the plurality of word lines and the plurality of data lines;

a plurality of sense amplifiers each of which is coupled to the plurality of data lines;

a data signal output circuit which is coupled to the plurality of sense amplifiers and which amplifies and outputs data signals to outside of the double data ratio synchronous type dynamic random access memory from the plurality of dynamic type memory cells in synchronism with rising and falling of clock signals generated by the clock generating circuit;

an input circuit for receiving data signals to be inputted to the dynamic type memory cells from outside of the double data ratio synchronous type dynamic random access memory; and a strobe signal output circuit which is operated in response to clock signals from the clock generating circuit and which generates data strobe signals in synchronism with the data signals from the data signal output circuit, wherein the clock generating circuit comprises:

a delay circuit which receives first clock signals and generates second clock signals by delaying the first clock signals for predetermined time;

a phase comparing circuit which compares a phase of the first clock signals and a phase of third clock signals based on the second clock signals and generates control signals; and a control circuit which controls the delay circuit for coinciding the phase of the first clock signals and the third clock signals in accordance with the control signals, wherein the semiconductor chip comprises:

a first power source pad for supplying a first power source voltage to the delay circuit;

a second power source pad for supplying a second power source voltage which is lower than the first power source voltage to the delay circuit;

a third power source pad for supplying a third power source voltage to the data signal output circuit; and a fourth power source pad for supplying a fourth power source voltage which is lower than the third power source voltage to the data signal output circuit, wherein the double data ratio synchronous type dynamic random access memory includes:

a first terminal which is coupled to the first power source pad;

a second terminal which is coupled to the second power source pad;

a third terminal which is coupled to the third power source pad and which is different from the first terminal; and a fourth terminal which is coupled to the fourth power source pad and which is different from the second terminal.

4. A double data ratio synchronous type dynamic type random access memory according to claim 3, wherein the first terminal is coupled with the first power source pad via first bonding wire, wherein the second terminal is coupled with the second power source pad via second bonding wire, wherein the third terminal is coupled with the third power source pad via third bonding wire, and wherein the fourth terminal is coupled with the fourth power source pad via fourth bonding wire.

5. A double data ratio synchronous type dynamic random access memory according to claim 4, wherein a first path for supplying power to the delay circuit includes the first terminal, the first power source pad, the second terminal and the second power source pad, and wherein a second path for supplying power to the internal circuit includes the third terminal, the third power source pad, the fourth terminal and the fourth power source pad and wherein the second path is different from the first path.

6. A double data ratio synchronous type dynamic random access memory, comprising:

a semiconductor chip, including:

a clock generating circuit comprising:

a delay circuit which receives first clock signals and generates second clock signals by delaying the first clock signals for predetermined time;

a phase comparing circuit which compares a phase of the first clock signals and a phase of third clock signals based on the second clock signals and generates control signals; and a control circuit which controls the delay circuit for coinciding the phase of the first clock signals and the third clock signals in accordance with the control signals;

a memory array, including:

a plurality of word lines;

a plurality of data lines; and a plurality of dynamic type memory cells which are coupled to the plurality of word lines and the plurality of data lines;

a plurality of sense amplifiers each of which is coupled to the plurality of data lines;

a data signal output circuit which is coupled to the plurality of sense amplifiers and which outputs data signals to outside of the double data ratio synchronous type dynamic random access memory from the plurality of dynamic type memory cells in synchronism with rising and falling of the second clock signals generated by the clock generating circuit;

a data input circuit for receiving data signals to be inputted to the plurality of dynamic type memory cells from outside of the double data ratio synchronous type dynamic random access memory;

a data strobe signal output circuit which is operated in response to the second clock signals and which generates data strobe signals in synchronism with the data signals from the data signal output circuit;

a first pad for supplying a first power source voltage to the delay circuit;

a second pad for supplying a second power source voltage which is lower than the first power source voltage to the delay circuit;

a third pad for supplying a third power source voltage to the data signal output circuit; and a fourth pad for supplying a fourth power source voltage which is lower than the third power source voltage to the data signal output circuit, wherein the double data ratio synchronous type dynamic random access memory includes:

a first terminal which is coupled to the first pad;

a second terminal which is coupled to the second pad;

a third terminal which is coupled to the third pad and which is different from the first terminal; and a fourth terminal which is coupled to the fourth pad and which is different from the second terminal.

7. A double data ratio synchronous type dynamic random access memory according to claim 6,
- wherein a row of pads including the first pad, the second pad, the third pad and the fourth pad is arranged in a center portion of the semiconductor chip along one direction,
- wherein the memory array is arranged between the row of pads and one side of the semiconductor chip along the one direction, and arranged between the row of pads and another side of the semiconductor chip along the one direction, and
- wherein the data input circuit, the data signal output circuit, and the data strobe signal output circuit are arranged between the row of pads and the one side of the semiconductor chip along the one direction.

8. A double data ratio synchronous type dynamic random access memory according to claim 7,
- wherein the first terminal is coupled with the first pad via first bonding wire,
- wherein the second terminal is coupled with the second pad via second bonding wire,
- wherein the third terminal is coupled with the third pad via third bonding wire, and
- wherein the fourth terminal is coupled with the fourth pad via fourth bonding wire.

* * * * *